(12) United States Patent
Charache et al.

(10) Patent No.: US 7,687,291 B2
(45) Date of Patent: Mar. 30, 2010

(54) LASER FACET PASSIVATION

(75) Inventors: Greg Charache, East Windsor, NJ (US);
John Hostetler, Hightstown, NJ (US);
Ching-Long Jiang, Bele Mead, NJ (US); Raymond J. Menna, Newtown, PA (US); Radosveta Radionova, Plainsboro, NJ (US); Robert W. Roff, Westfield, NJ (US); Holger Schlüter, Princeton, NJ (US)

(73) Assignee: Trumpf Photonics Inc., Cranbury, NJ (US)

( * ) Notice: Subject to any disclaimer, the term of this patent is extended or adjusted under 35 U.S.C. 154(b) by 0 days.

(21) Appl. No.: 11/277,602

(22) Filed: Mar. 27, 2006

(65) Prior Publication Data
US 2006/0216842 A1      Sep. 28, 2006

Related U.S. Application Data

(60) Provisional application No. 60/664,931, filed on Mar. 25, 2005.

(51) Int. Cl.
*H01L 21/00* (2006.01)
(52) U.S. Cl. .......................................... 438/33; 438/38
(58) Field of Classification Search .................. 438/22, 438/28, 33, 38, 460
See application file for complete search history.

(56) References Cited

U.S. PATENT DOCUMENTS

| | | | |
|---|---|---|---|
| 4,095,011 A | 6/1978 | Hawrylo et al. |
| 4,282,494 A | 8/1981 | Yonezu et al. |
| 4,309,668 A | 1/1982 | Ueno et al. |
| 4,317,086 A | 2/1982 | Scifres et al. |
| 4,337,443 A | 6/1982 | Umeda et al. |
| 4,546,481 A | 10/1985 | Yamamoto et al. |
| 4,558,448 A | 12/1985 | dePoorter et al. |
| 4,563,368 A | 1/1986 | Tihanyi et al. |
| 4,670,966 A | 6/1987 | De Poorter et al. |
| 4,713,821 A | 12/1987 | Bradford et al. |
| 4,722,088 A | 1/1988 | Wolf |
| 4,744,089 A | 5/1988 | Montroll et al. |
| 4,815,089 A | 3/1989 | Miyauchi et al. |
| 4,845,725 A | 7/1989 | Welch et al. |
| 4,856,017 A | 8/1989 | Ungar |
| 4,942,585 A | 7/1990 | Ungar |
| 4,951,291 A | 8/1990 | Miyauchi et al. |
| 4,961,196 A | 10/1990 | Endo |
| 4,964,135 A | 10/1990 | Mitsui et al. |
| 5,020,068 A | 5/1991 | Isshiki |
| 5,045,500 A | 9/1991 | Mitsui et al. |
| 5,063,173 A | 11/1991 | Gasser et al. |

(Continued)

*Primary Examiner*—Savitri Mulpuri
(74) *Attorney, Agent, or Firm*—Fish & Richardson P.C.

(57) ABSTRACT

Methods of preparing front and back facets of a diode laser include controlling an atmosphere within a first chamber, such that an oxygen content and a water vapor content are controlled to within predetermined levels and cleaving the diode laser from a wafer within the controlled atmosphere of the first chamber to form a native oxide layer hating a predetermined thickness on the front and back facets of the diode laser. After cleavage, the diode laser is transported from the first chamber to a second chamber within a controlled atmosphere, the native oxide layer on the front and back facets of the diode laser is partially removed, an amorphous surface layer is formed on the front and back facets of the diode laser, and the front and back facets of the diode laser are passivated.

32 Claims, 20 Drawing Sheets

U.S. PATENT DOCUMENTS

| | | | | |
|---|---|---|---|---|
| 5,144,634 | A | 9/1992 | Gasser et al. | |
| 5,151,913 | A | 9/1992 | Ueno | |
| 5,278,926 | A | 1/1994 | Doussiere | |
| 5,280,535 | A | 1/1994 | Gfeller et al. | |
| 5,290,535 | A | 3/1994 | Zuck et al. | |
| 5,331,627 | A | 7/1994 | Childers et al. | |
| 5,469,457 | A | 11/1995 | Nagai et al. | |
| 5,491,711 | A | 2/1996 | Mand et al. | |
| 5,539,571 | A | 7/1996 | Welch et al. | |
| 5,574,741 | A | 11/1996 | Arimoto | |
| 5,608,750 | A | 3/1997 | Nakatsuka et al. | |
| 5,665,637 | A | 9/1997 | Chand | |
| 5,668,049 | A | 9/1997 | Chakrabarti et al. | |
| 5,737,351 | A | 4/1998 | Ono | |
| 5,757,883 | A | 5/1998 | Haisma et al. | |
| 5,812,580 | A | 9/1998 | Nabiev et al. | |
| 5,821,171 | A | 10/1998 | Hong et al. | |
| 5,832,018 | A | 11/1998 | Ohkubo | |
| 5,844,931 | A | 12/1998 | Sagawa et al. | |
| 5,940,424 | A | 8/1999 | Dietrich et al. | |
| 5,943,356 | A | 8/1999 | Kawai | |
| 5,953,358 | A | 9/1999 | Ishikawa et al. | |
| 5,956,359 | A | 9/1999 | Adams et al. | |
| 5,960,021 | A | 9/1999 | De Vrieze et al. | |
| 5,962,873 | A | 10/1999 | Ohkubo et al. | |
| 5,995,528 | A | 11/1999 | Fukunaga et al. | |
| 6,005,881 | A | 12/1999 | Ikoma | |
| 6,014,396 | A | 1/2000 | Osinski et al. | |
| 6,028,874 | A | 2/2000 | Wada et al. | |
| 6,080,598 | A * | 6/2000 | Kawai | 438/33 |
| 6,127,691 | A | 10/2000 | Fukunaga et al. | |
| 6,272,161 | B1 | 8/2001 | Petrescu-Prahova | |
| 6,278,720 | B1 | 8/2001 | Lee et al. | |
| 6,285,695 | B1 | 9/2001 | Asano et al. | |
| 6,323,052 | B1 | 11/2001 | Horie et al. | |
| 6,370,171 | B1 | 4/2002 | Horn et al. | |
| 6,373,875 | B1 | 4/2002 | Yu et al. | |
| 6,375,364 | B1 | 4/2002 | Wu | |
| 6,396,864 | B1 | 5/2002 | O Brien et al. | |
| 6,406,932 | B2 | 6/2002 | Lee et al. | |
| 6,519,272 | B1 | 2/2003 | Baliga et al. | |
| 6,541,291 | B2 | 4/2003 | Kuniyasu | |
| 6,546,003 | B1 | 4/2003 | Farris | |
| 6,618,409 | B1 * | 9/2003 | Hu et al. | 372/43.01 |
| 6,670,211 | B2 * | 12/2003 | Ohkubo | 438/33 |
| 6,674,095 | B1 * | 1/2004 | Watanabe | 257/98 |
| 6,782,024 | B2 | 8/2004 | Schmidt et al. | |
| 6,985,504 | B2 * | 1/2006 | Ueda et al. | 372/43.01 |
| 2002/0197757 | A1 * | 12/2002 | Hubbard et al. | 438/31 |
| 2005/0153470 | A1 * | 7/2005 | Lindstrom et al. | 438/29 |

\* cited by examiner

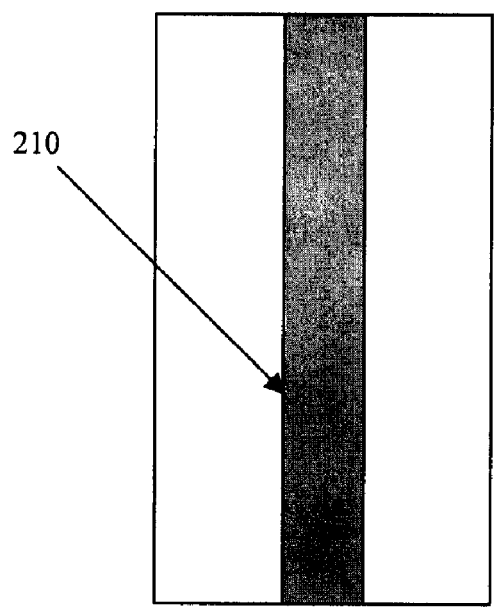
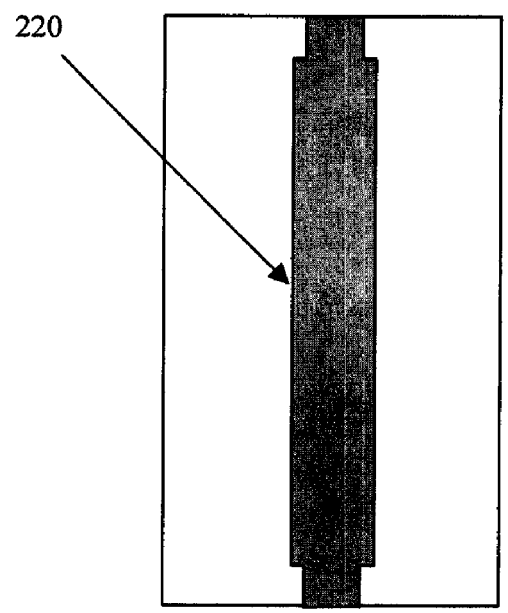
FIG. 2A  FIG. 2B

LASER FACET PASSIVATION

CROSS REFERENCE TO RELATED APPLICATION

This application claims priority to U.S. Application No. 60/664,931, filed on Mar. 25, 2005, which is incorporated herein by reference in its entirety.

TECHNICAL FIELD

The invention relates to a high power diode laser facet passivation process that improves the manufacturability and reliability of diode lasers.

BACKGROUND

High-power diode lasers can be used as pump sources for conventional solid-state lasers, thin-disk lasers, and fiber lasers due to their high electro-optic efficiency, narrow spectral width, and high beam quality. For such applications, long lifetimes (for example, exceeding 30,000 hours), reliable and stable output, high output power, high electro-optic efficiency, and high beam quality are generally desirable. Such performance criteria continue to push diode laser designs to new performance plateaus.

Because modern crystal growth reactors can produce semiconductor materials of very high quality, the long-term reliability of high-power diode lasers can depend strongly on the stability of the laser facets. Although facet stability is generally better for conventionally-coated Al-free materials than for AlGaAs materials, high-power Al-free GaAs lasers operating at wavelengths less than one micron nevertheless suffer from facet degradation that compromises the reliability of the diode laser by causing short and long-term decreases in the performance criteria of the diode.

Laser facet degradation is a complex chemical reaction that can be driven by light, current, and heat, and can lead to short-term power degradation during burn-in, long-term power degradation during normal operation, and, in severe cases, to catastrophic optical mirror damage (COMD). Complex oxides and point defects present on a cleaved surface of a diode laser can be trapped at the interface between the reflective coating and the semiconductor material. As current is applied to the device, charge carriers can diffuse toward the facet as the surface acts as a carrier sink due to the presence of states within the band gap created by point defects and oxidation of the surface. Light emission from the diode can photo-excite the carriers at the facet surface, resulting in electron-hole pair generation, and charges generated from the electron-hole pairs can electro-chemically drive an oxidation reaction at the facet. Additionally, non-radiative recombination can occur, resulting in point defect motion and localized heating. Heating of the semiconductor material can induce thermal oxidation at the facet, further increasing the absorbing oxide layer thickness formed at the semiconductor-oxide interface.

In other situations, native oxides on GaAs and related semiconductor compounds generally stratify, leaving mostly GaO near the surface of the compound. Elemental arsenic can precipitate at the semiconductor-oxide interface either as island-like point defects or as a uniform layer. The metallic-like arsenic defects are strong absorbing centers and are believed to contribute to light absorption at the facet. As the oxidation reaction at the surface continues, the total absorption by the interface layer increases as the facet region heats up, significantly reducing the band gap energy at the facet, and leading to thermal runaway.

SUMMARY

In first general aspect, the invention features methods of preparing a diode laser by controlling an atmosphere within a first chamber such that an oxygen content and a water vapor content are controlled to within predetermined levels and cleaving the diode laser from a wafer within the controlled atmosphere of the first chamber to form a native oxide layer having a predetermined thickness on at least one facet of the diode laser. After cleaving, the diode laser is transported from the first chamber to a second chamber within a controlled atmosphere, the facet of the diode laser is cleaned by at least partially removing the native oxide layer on the facet, and the facet of the diode laser is passivated.

The new methods provide a high-volume manufacturing process that allows repeatable and reliable diode laser facet passivation. By partially removing the native oxides on the diode laser facets and forming an amorphous surface layer, lower temperatures are achieved near the facets, which improves the performance criteria of the diode laser. The repeatable partial removal of the native oxide that forms on the diode laser facets following cleaving and the subsequent passivation of the surface prevents reoxidation.

Implementations can include one or more of the following features. For example, the controlled atmosphere can have a pressure within about 20% of atmospheric pressure (for example, greater than atmospheric pressure) and can have an oxygen content less than about 10 ppm and a water vapor content of less than about 10 ppm. The cleaning can include forming an amorphous surface layer on the facet of the diode laser.

Cleaving the diode laser from a wafer can include cleaving within the controlled atmosphere of the chamber to form a native oxide layer having a predetermined thickness on front and back facets of the diode laser. Cleaning can include cleaning the front and back facets of the diode laser including partially removing the native oxide layer on the front and back facets. Passivating can include passivating the front and back facets of the diode laser.

Cleaving the laser from the wafer can include scribing cleaving marks along an edge of the wafer, scribing chip marks within an interior of the wafer, breaking the wafer along the cleave marks, and breaking the wafer along the chip marks. Cleaving the laser from the wafer can include scribing cleaving marks along an edge of the wafer, breaking the wafer along the cleave marks, and breaking the wafer along lines etched into to wafer during wafer processing.

The methods can include transporting the wafer from the controlled atmosphere to a vacuum chamber without exposing the wafer to a greater partial pressure of oxygen or water vapor than exists in the controlled atmosphere, and evacuating the vacuum chamber to a base pressure of less than about $10^{-8}$ Torr. Partially removing the native oxide layer can include bombarding the native oxide layer with an ion beam within the vacuum chamber. Forming the amorphous surface layer can include bombarding the native oxide layer with an ion beam within the vacuum chamber. The bombarding ion beam can include xenon ions, argon ions, neon ions, nitrogen ions, protons, and/or forming gas ions. Passivating the facets can include depositing a layer of material that includes silicon, amorphous silicon, and/or hydrogenated amorphous silicon on the facets within the vacuum chamber.

The methods can include depositing an anti-reflection coating on the front facet, and depositing a high reflection coating on the back facet. The anti-reflection coating can include aluminum oxide, tantalum pentoxide, silicon dioxide, and/or silicon nitride. The high reflection coating can include alternating layers of low index of refraction material and high index of refraction material. The low index of refraction material can include aluminum oxide, and the high index of refraction material can include amorphous silicon and/or tantalum pentoxide.

The diode laser can be flipped without exposing the diode laser to atmosphere between the steps of partially removing the native oxide layer on the front facet, forming the amorphous surface layer on the front facet, and passivating the front facet and the steps of partially removing the native oxide layer on the back facet, forming the amorphous surface layer on the back facet, and passivating the back facet. The diode laser can be flipped without exposing the diode laser to atmosphere before the steps of partially removing the native oxide layer on the front facet, forming the amorphous surface layer on the front facet, and passivating the front facet.

The diode laser can be flipped without exposing the diode laser to atmosphere between the steps of depositing the high reflection coating and depositing the anti-reflection coating.

In another general aspect, the invention features diode lasers formed by any of the methods described herein. In another general aspect, the invention features diode laser arrays formed by any of the methods described herein.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The details of one or more implementations are set forth in the accompanying drawings and the description below. Other features and advantages will be apparent from the description and drawings, and from the claims.

DESCRIPTION OF DRAWINGS

FIGS. 2A and 2B are schematic top views of a first mask layout for defining a ridge in a ridge waveguide diode laser with unpumped facets.

Like reference symbols in the various drawings indicate like elements.

DETAILED DESCRIPTION

In general, a method of preparing front and back facets of a diode laser is described. The method integrates a number of diode laser processing steps (for example, cleaving, stacking, and facet coating) within a controlled environment (for example, at atmospheric pressure, <10 ppm oxygen, <10 ppm water vapor) to reproducibly oxidize the facets, partially remove the native oxide, form an amorphous surface layer, passivate the facets, and deposit optical coatings.

Fabrication of Diode Lasers with Unpumped Facets

Figure 1A:
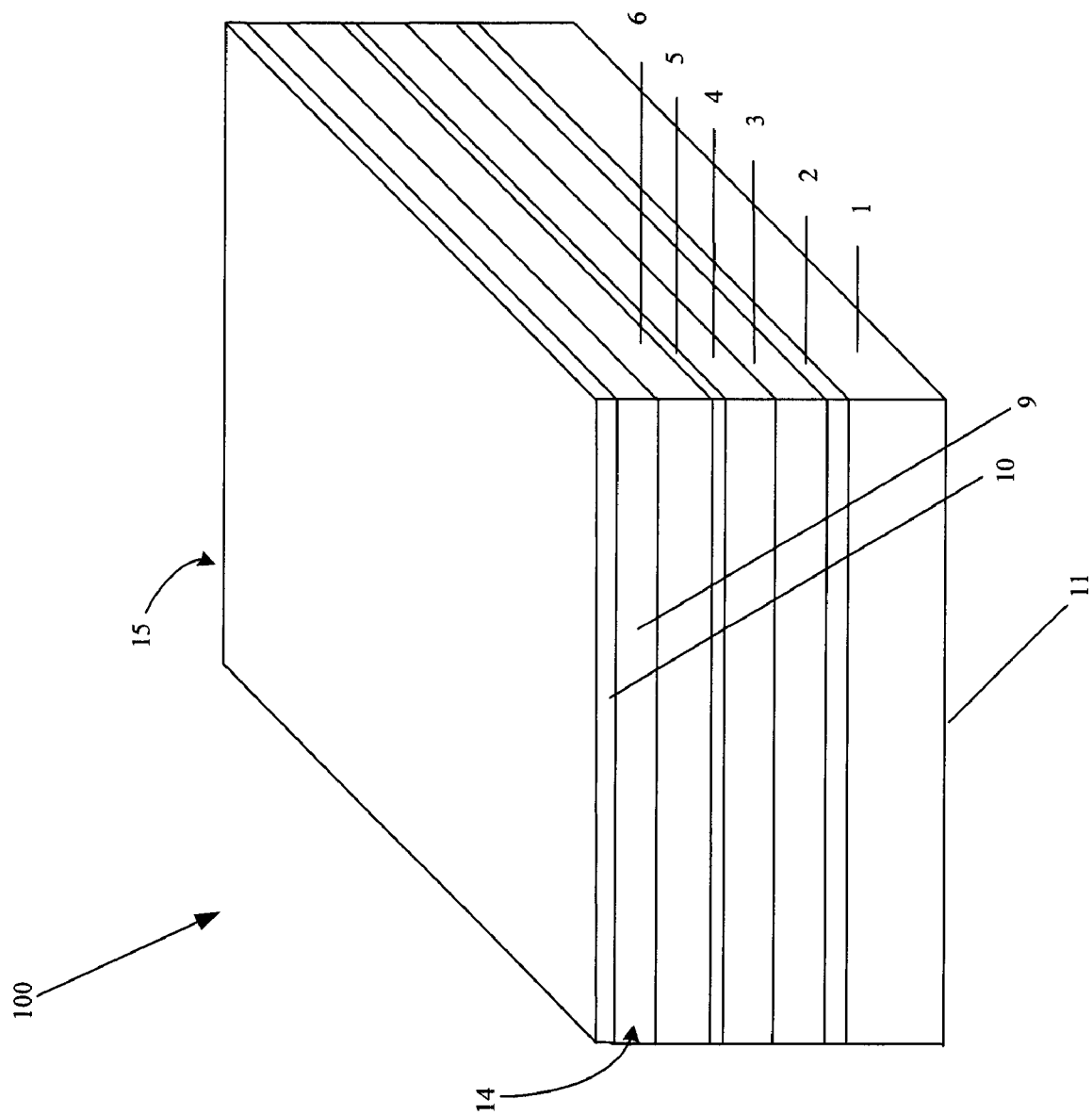
FIGS. 1A, 1B, and 1C are schematic perspective views of a ridge waveguide diode laser with unpumped facet regions.

Referring to FIG. 1A, a semiconductor light-emitting device (for example, a high-power diode laser) 100 includes multiple semiconductor layers that are grown epitaxially on a substrate 1. For example, a GaAs buffer layer 2 can be grown on a GaAs substrate 1, and an n-doped InGaP cladding layer 3 can be grown on the buffer layer 2. Above the n-doped cladding layer 3, an InGaAs active layer 5 can be grown between two InGaAsP waveguide layers 4 and 6. The relative proportions of the In, Ga, and As in the active layer 5 and the thickness of the active layer can be selected such that the diode laser 100 has a desired operating wavelength. Above the upper waveguide layer 6, a p-doped InGaP cladding layer 9 and a GaAs cap layer 10 can be grown. The semiconductor layers can be grown by various deposition techniques, including, for example, molecular beam epitaxy (MBE), chemical vapor deposition ("CVD"), and vapor phase epitaxy ("VPE"). Multiple diode lasers 100 can be grown on a single wafer and then cleaved from the wafer, as described in more detail below.

Figure 1B:
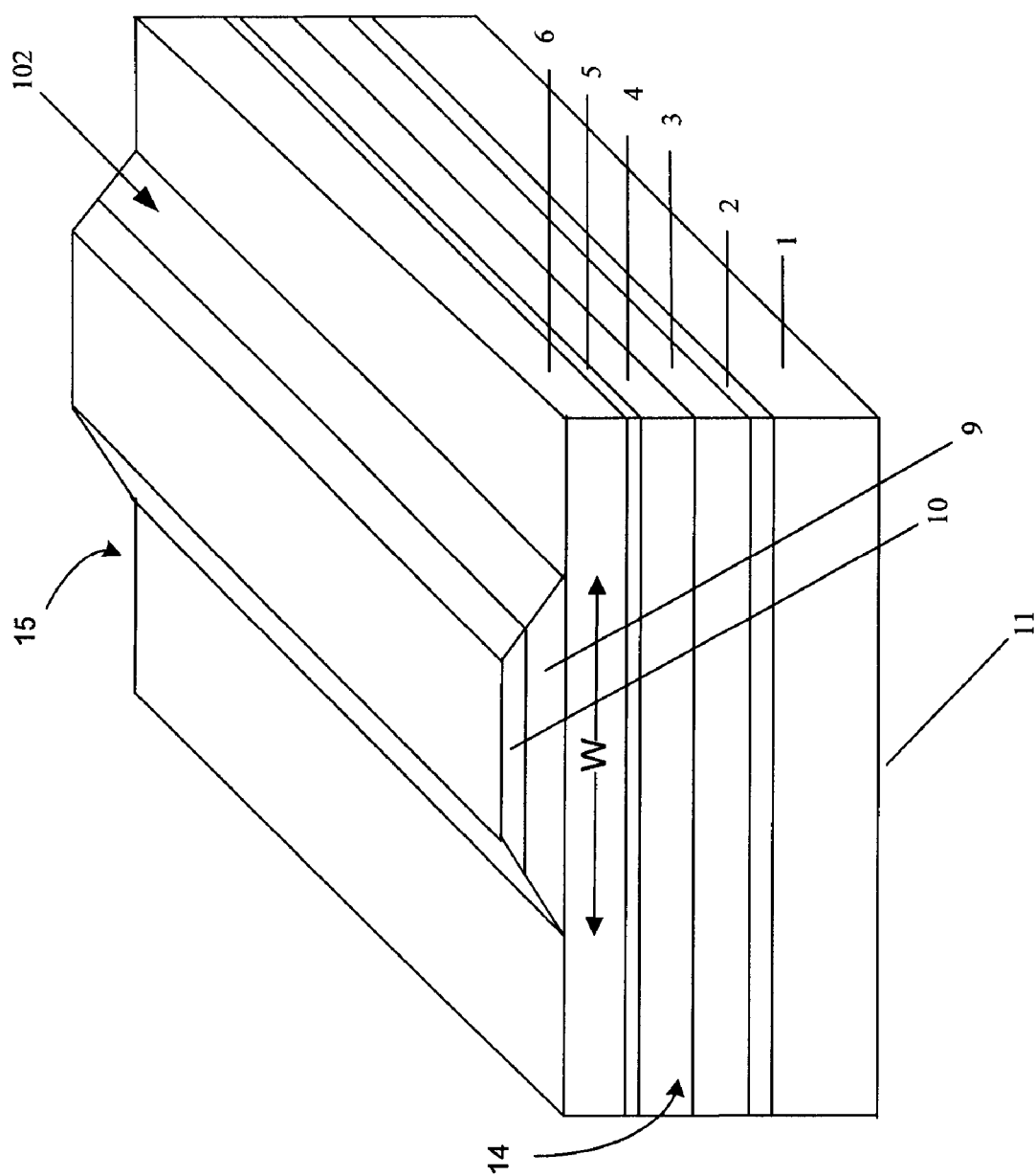

Referring to FIG. 1B, after growth of the semiconductor layers, a ridge 102 having a width, w, of about 3-200 microns, or more particularly 80-120 microns (for example, 100 microns), and extending from a front facet 14 to a back facet 15 of the diode laser 100 can be formed in the upper layers of the diode laser 100 by selectively removing portions of the cap layer 10 and the cladding layer 9 adjacent to the ridge 102. The ridge 102 is defined using photolithography, and then portions of the cap layer 10 and the cladding layer 9 adjacent to the ridge 102 are etched down to the interface between the upper waveguide layer 6 and the upper cladding layer 9. The etching can be performed with a liquid or plasma etchant. For example, when $HCl:H_3PO_4$ acid is used as an etchant, the waveguide layer 6 acts as an etch stop layer, so the cap layer 10 and the cladding layer 9 adjacent to the ridge 102 are removed, but the etching process ends when the etchant reaches the waveguide layer 6.

The width and length of the ridge 102 are defined by a ridge etch mask 210 or 220, as shown, respectively, in FIG. 2A and in FIG. 2B. The ridge mask 210 can have a constant width (for example, a width greater than 10 microns), as shown in FIG. 2A, or the ridge etch mask 220 can be narrower at the ends than in the middle of the device, as shown in FIG. 2B, to create either a constant width or a tapered-width ridge 102 in the diode laser 100. A tapered width waveguide can act as a mode filter and thereby reduce the slow axis divergence of the beam emitted from the diode laser 100.

Figure 1C:
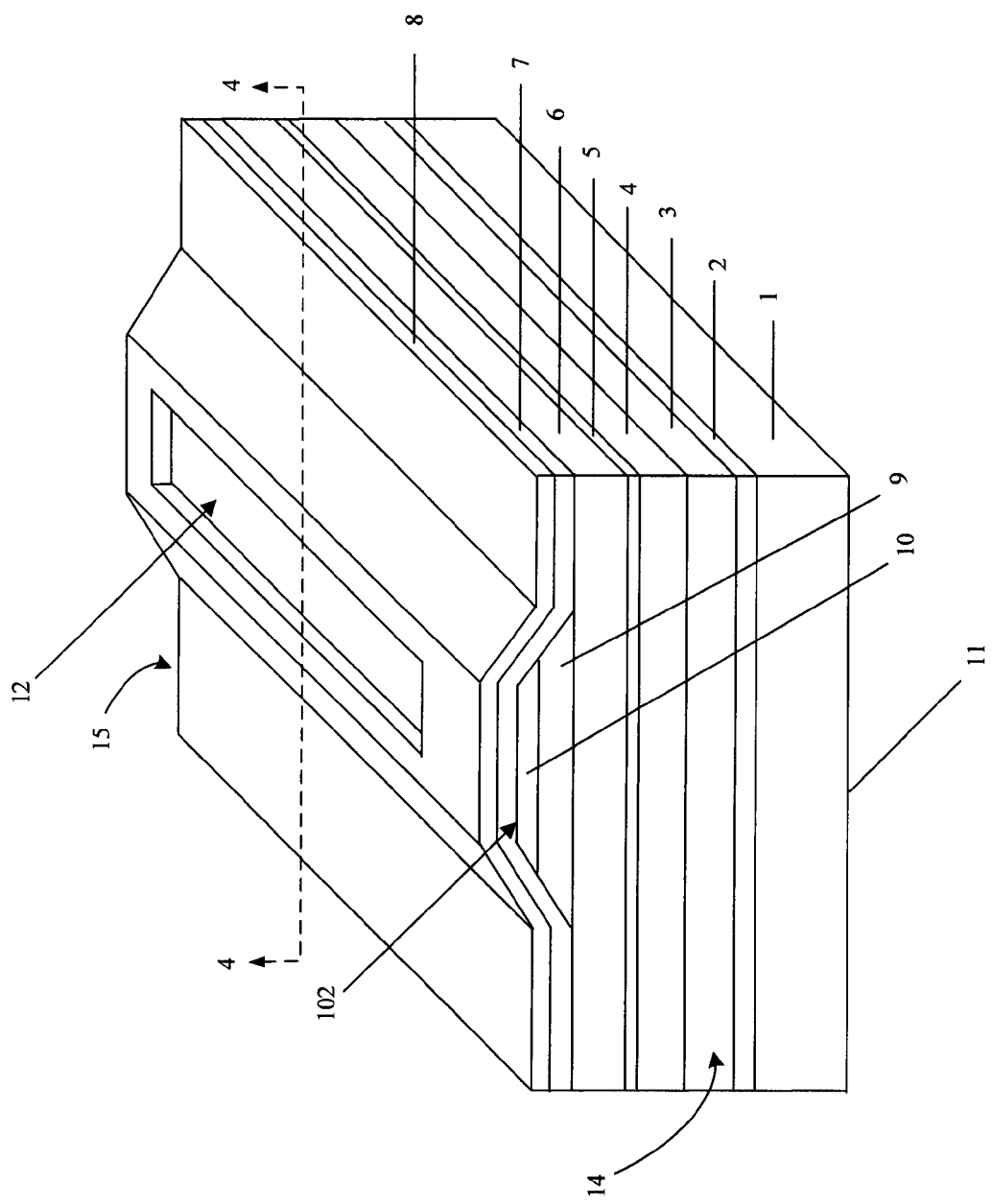

Referring to FIG. 1C, after formation of the ridge 102, a $Si_3N_4$ insulating layer 7 can be deposited on the upper surface of the device 100, thus covering the ridge 102. The insulating layer 7 can be deposited, for example, through a plasma-enhanced CVD process, in which silane and ammonia gas are flowed over the device 100, while the device is heated to about 300° C., and a strong radio-frequency electromagnetic field is applied in the region of the device to crack the gases, allowing a $Si_3N_4$ layer to form on the top of the device.

Figure 3:
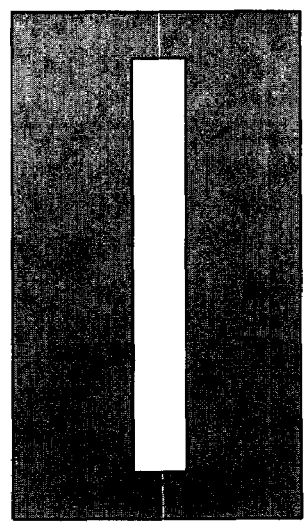
FIG. 3 is a schematic top view of a second mask layout for defining a top electrical contact to a ridge waveguide diode laser with unpumped facets.

After deposition of the insulating layer 7, the insulating layer is patterned on the top surface of the ridge 102 through photolithography to define a region of electrical contact to the cap layer 10. As shown in FIG. 3, the mask used to define the electrical contact to the cap layer 10 has a pattern with a width, $w_1$, that is approximately equal to or slightly narrower than the width of the ridge 102, but that is shorter than the length of the ridge 102 and does not extend to the ends (facet regions) of the diode laser 100.

Following lithography, a portion of the insulating layer 7 on the top surface of the ridge 102 is removed by an etching process to form an aperture 12 that does not extend to the ends of the ridge 102 and the diode laser 100, thereby exposing a portion of the cap layer 10 that runs along the ridge 102. Then, a top-side metallization contact layer 8 is deposited over the top surface of the device 100, covering the ridge 102 and the portion of cap layer 10 exposed in the aperture 12 defined in the insulating layer 7.

Figure 4:
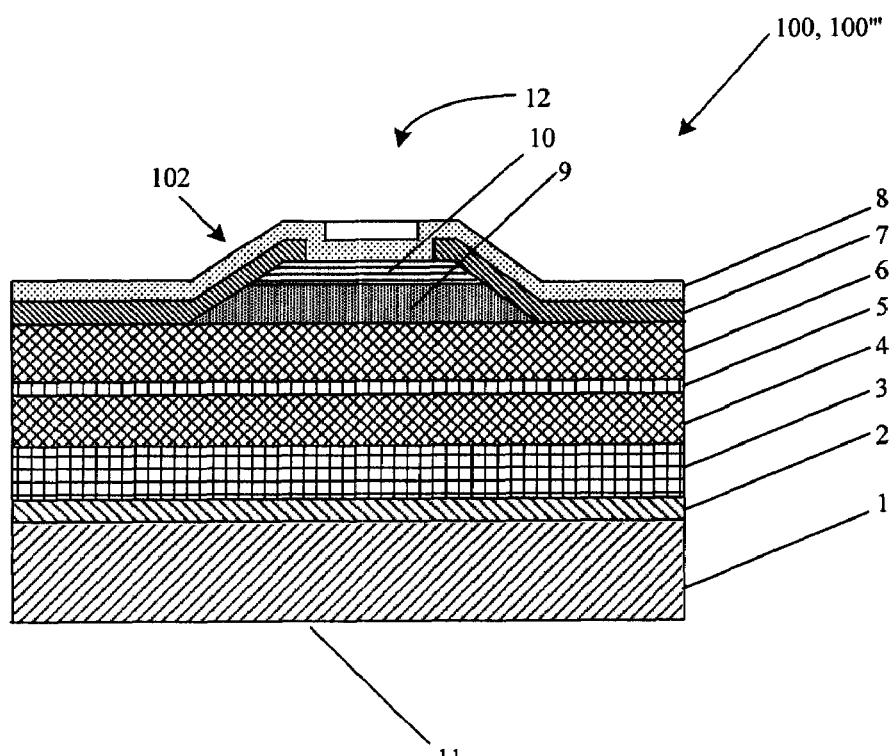
FIG. 4 is a schematic cross-sectional view of the diode laser of FIG. 1C through the plane marked 4-4 in FIG. 1C.

FIG. 4 shows a cross section of the diode laser 100 shown in FIG. 1C. Insulating layer 7 is located above the semiconductor epitaxial layers and on the sides of the ridge 102 defined in the cap layer 10 and the upper cladding layer 9, but includes an opening above the ridge 102. The metallization contact layer 8 is located above the ridge 102 and contacts the cap layer 10 through the opening 12 formed in the insulating layer 7.

When forming arrays of diode lasers on a single substrate, an additional mask layer and etching step may be introduced following ridge etching to optically isolate neighboring diode lasers and prevent lateral amplified spontaneous emission, or so-called "cross-lasing."

After growth of the epitaxial layers, fabrication of the ridge, and deposition of the insulating and contact layers, the laser wafer undergoes standard backside processing to provide a back-side metallization layer 11 on the substrate 1. The wafer upon which the lasers are grown is then cleaved to create individual diode lasers or diode laser arrays 100. The wafer is cleaved such that facets of the individual diode lasers 100 are formed more than 10 microns from the point on the ridge 102 at which contact between the metallization contact layer 8 and the cap layer 10 ends. Finally, the facets of the individual diode lasers 100 are coated with a material having a desired reflectivity. The cleaving and facet coating process is described in more detail below.

The result of the selective etching of the $Si_3N_4$ layer and deposition of the metallization layer 8 is that an electrical contact is applied to the cap layer 10 along the length of the ridge 102 but not near the ends of the ridge (for example, within about 10-100 microns, or more particularly 20-60 microns (for example, 30 microns) of the ends of the diode laser) where the facets of diode laser 100 are located. During operation of the diode laser 100, current is injected into the device 100 along the ridge 102 under the region where the metallization contact layer 8 contacts the cap layer 10, but not at the ends of the ridge 102 near the facets 14, 15 where the metallization contact layer 8 is separated from the cap layer 10 by the insulating layer 7. Thus, portions of the laser cavity under the ridge 102 near the facets are unpumped.

Figure 5:
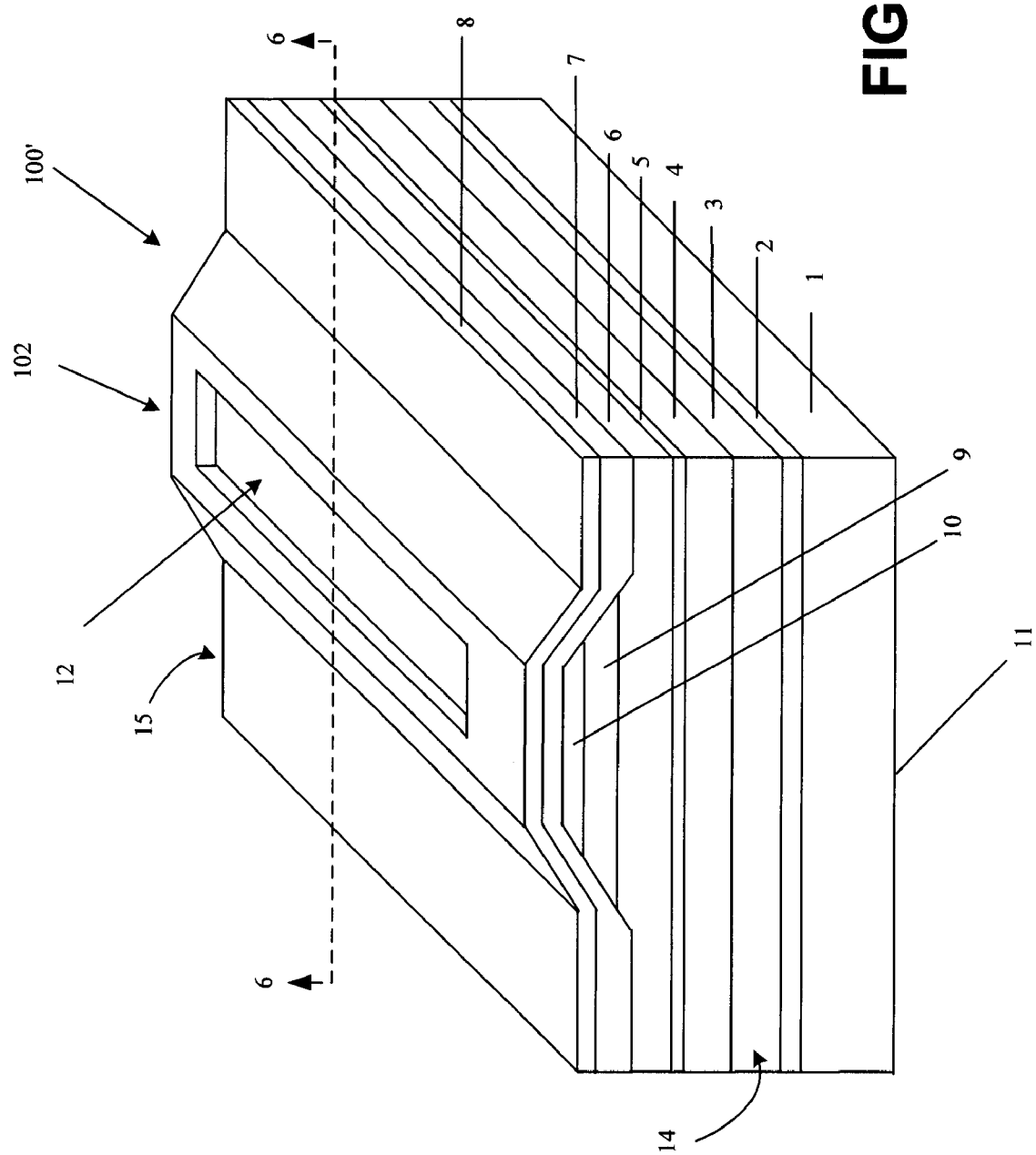
FIG. 5 is a schematic perspective view of a second implementation of a ridge waveguide diode laser with unpumped facet regions.
Figure 7:
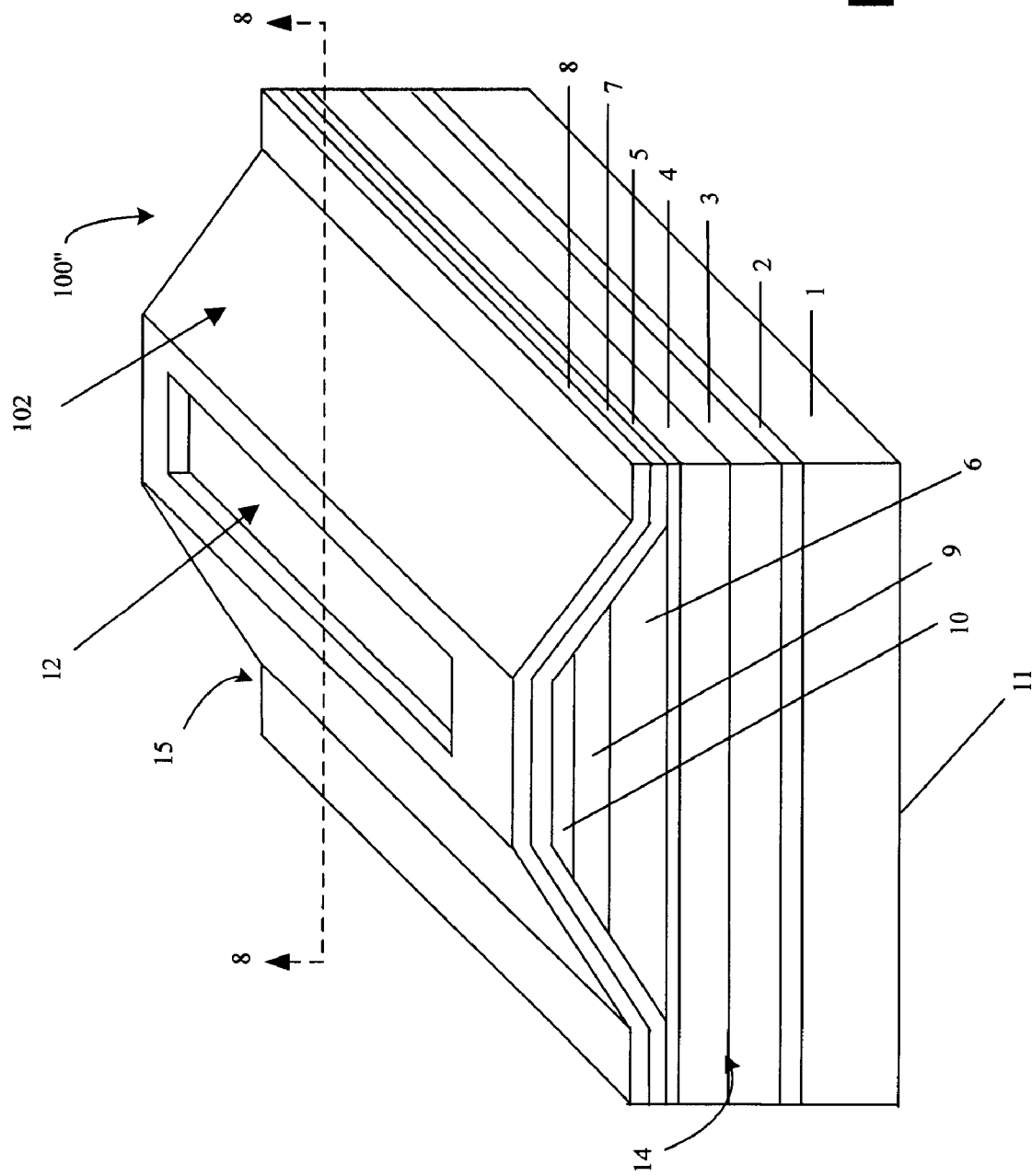
FIG. 7 is a schematic perspective view of a third implementation of a ridge waveguide diode laser with unpumped facet regions.

As shown in FIG. 5, the diode laser 100' can be selectively etched such that the metallization contact layer 8 does not contact the cap layer 10 in the vicinity of the facets 14, 15, but such that the ridge 102 is etched completely through the upper clad layer 9 and partially through the upper waveguide layer 6. The ridge 102 can also be formed by etching completely though the upper waveguide layer, as shown in FIG. 7. The InGaAsP upper waveguide layer 6 can be etched with an etchant, such as, for example, $H_2O_2:H_2SO_4:H_2O$.

Figure 6:
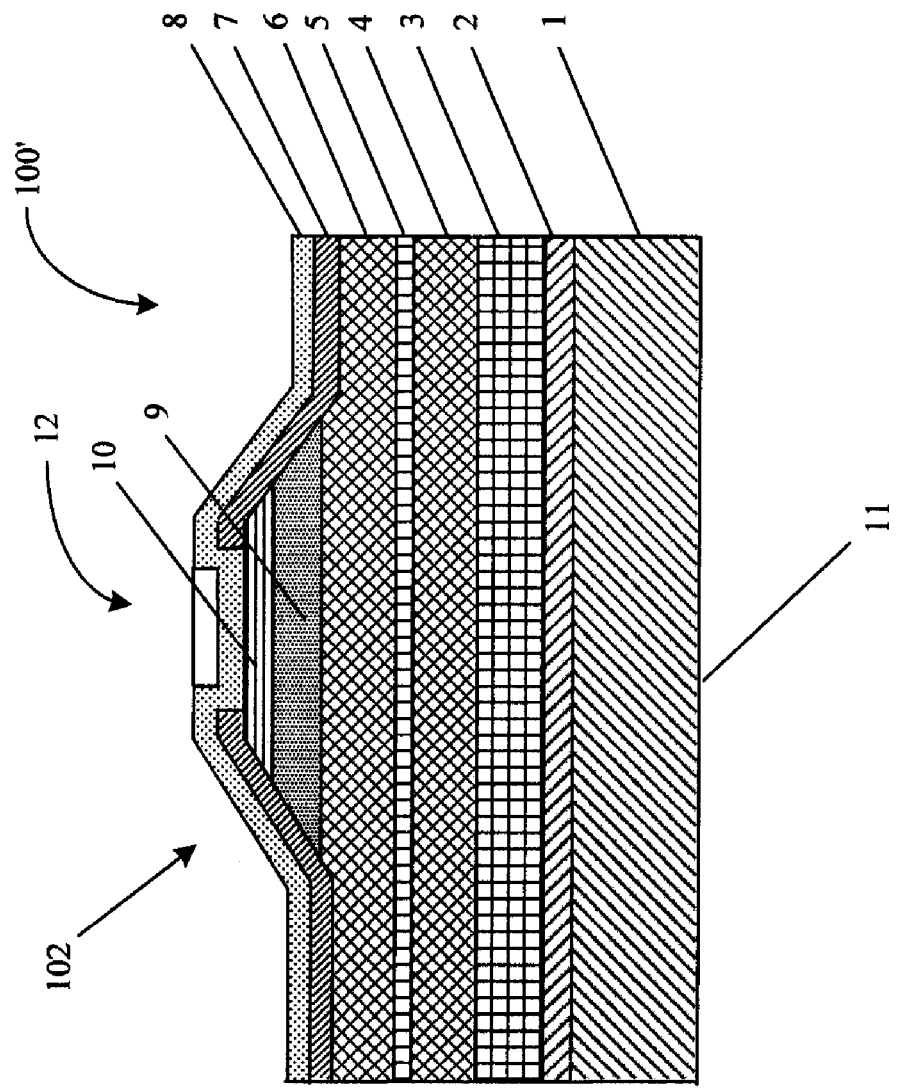
FIG. 6 is a schematic cross-sectional view of the diode laser of FIGS. 5 and 11 through the plane marked 6-6 in FIGS. 5 and 11.

FIG. 6 shows a cross section of the diode laser 100' shown in FIG. 5. The insulating layer 7 is located above the semiconductor epitaxial layers and on the sides of the ridge 102 defined in the cap layer 10 and the upper cladding layer 9 but is at a lower depth, and penetrates into the upper waveguide layer 6, to the sides of the ridge 102. The insulating layer 7 includes an opening 12 above the ridge 102 through which the metallization contact layer 8 contacts the cap layer 102 to inject current into the device 100.

Figure 8:
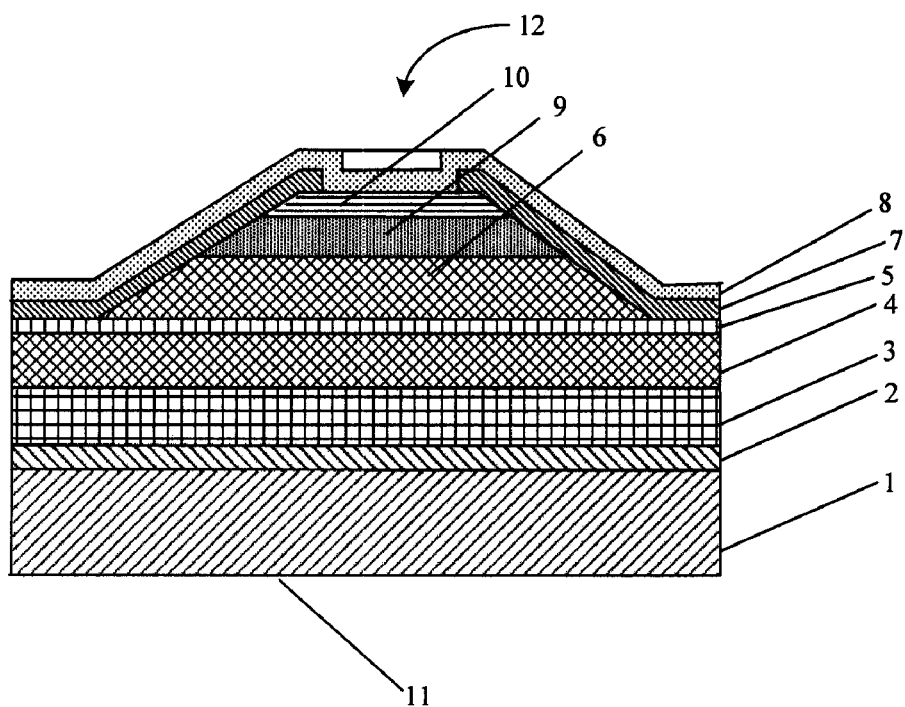
FIG. 8 is a schematic cross-sectional view of the diode laser of FIGS. 7 and 12 through the plane marked 8-8 in FIGS. 7 and 12.

FIG. 8 shows a cross section of the diode laser shown in FIG. 7, in which the ridge 102 is defined in the cap layer 10, the upper cladding layer 9, and the upper waveguide layer 6 by etching completely though the upper waveguide layer 6. The depth of the etch is controlled by allowing the etching process to proceed for a predetermined length of time. The deeper etch depth results in improved lateral current confinement, though the deeper etch depth also introduces a lateral index step, which could allow additional lateral modes that broaden the slow axis divergence of the beam emitted from the diode laser 100.

Figure 10:
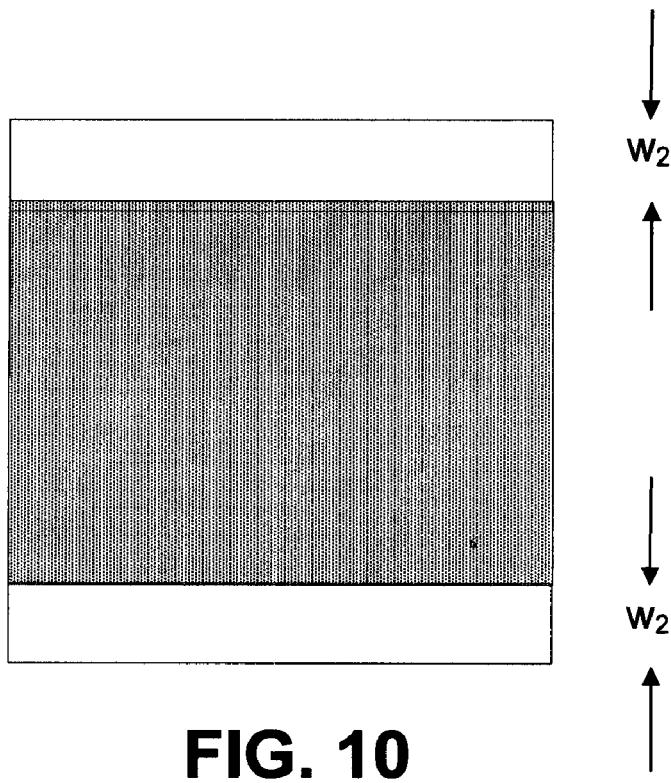
FIG. 10 is a schematic top view of a mask layout for defining unpumped facet regions on a diode laser.
Figure 9:
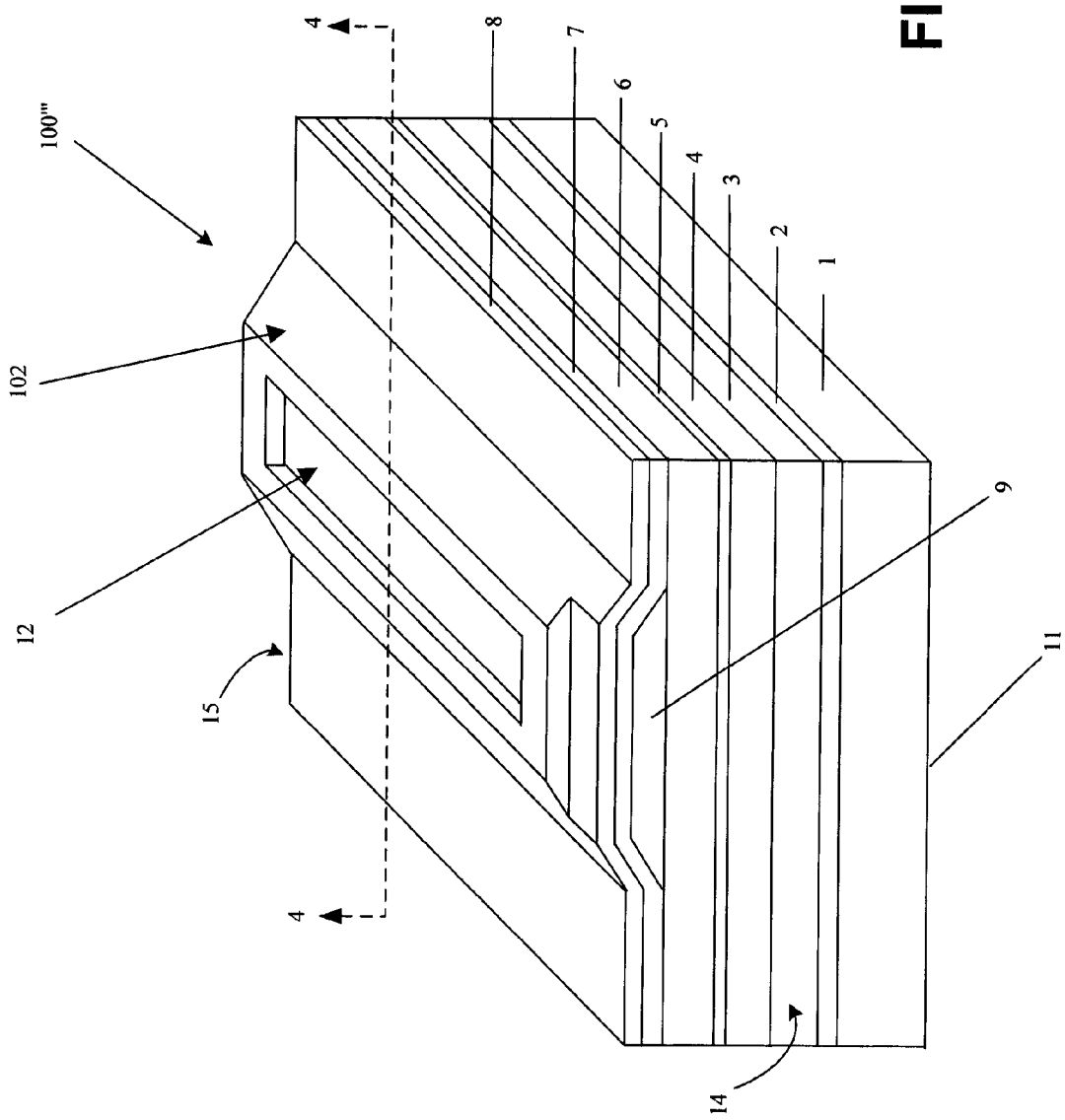
FIG. 9 is a schematic perspective view of a fourth implementation of a ridge waveguide diode laser with unpumped facet regions.

As shown in FIG. 9, a portion of the cap layer 10 can be removed in the vicinity of the front facet 14 and/or the back facet 15. Thus, only a very low amount of current is injected into the active layer near the front facet 14 and the back facet 15. After growth of the epitaxial layers, shown in FIG. 1A, the top cap layer 10 is patterned through photolithography to define one or more regions of the cap layer 10 near the front facet 14 and/or the back facet 15 to be removed. Referring also to FIG. 10, the mask used to define the portion(s) of the cap layer 10 to be removed has a pattern with a width, $w_2$, of about 10-100 microns, or more particularly 20-60 microns (for example, 30 microns) near the facets 14, 15 of the diode laser 100. After etching to remove the cap layer 10 near the front facet 14 and/or near the back facet 15, the ridge 102 is created, the insulating layer 7 is deposited and patterned to create an opening 12 for a top contact, and the metallization contact layer 8 is deposited. Alternatively, the ridge 102 can be created before removing the portions of the cap layer 102 in the vicinity of the front facet 14 and/or back facet 15.

FIG. 4 shows a cross section of the diode laser shown in FIG. 9. The insulating layer 7 is located above the semiconductor epitaxial layers and on the sides of the ridge 102 defined in the cap layer 10 and the upper cladding layer 9 but includes an opening above the ridge 102. The metallization contact layer 8 is located above the ridge 102 and contacts the cap layer 10 through the opening 12 formed in the insulating layer 7.

Figure 11:
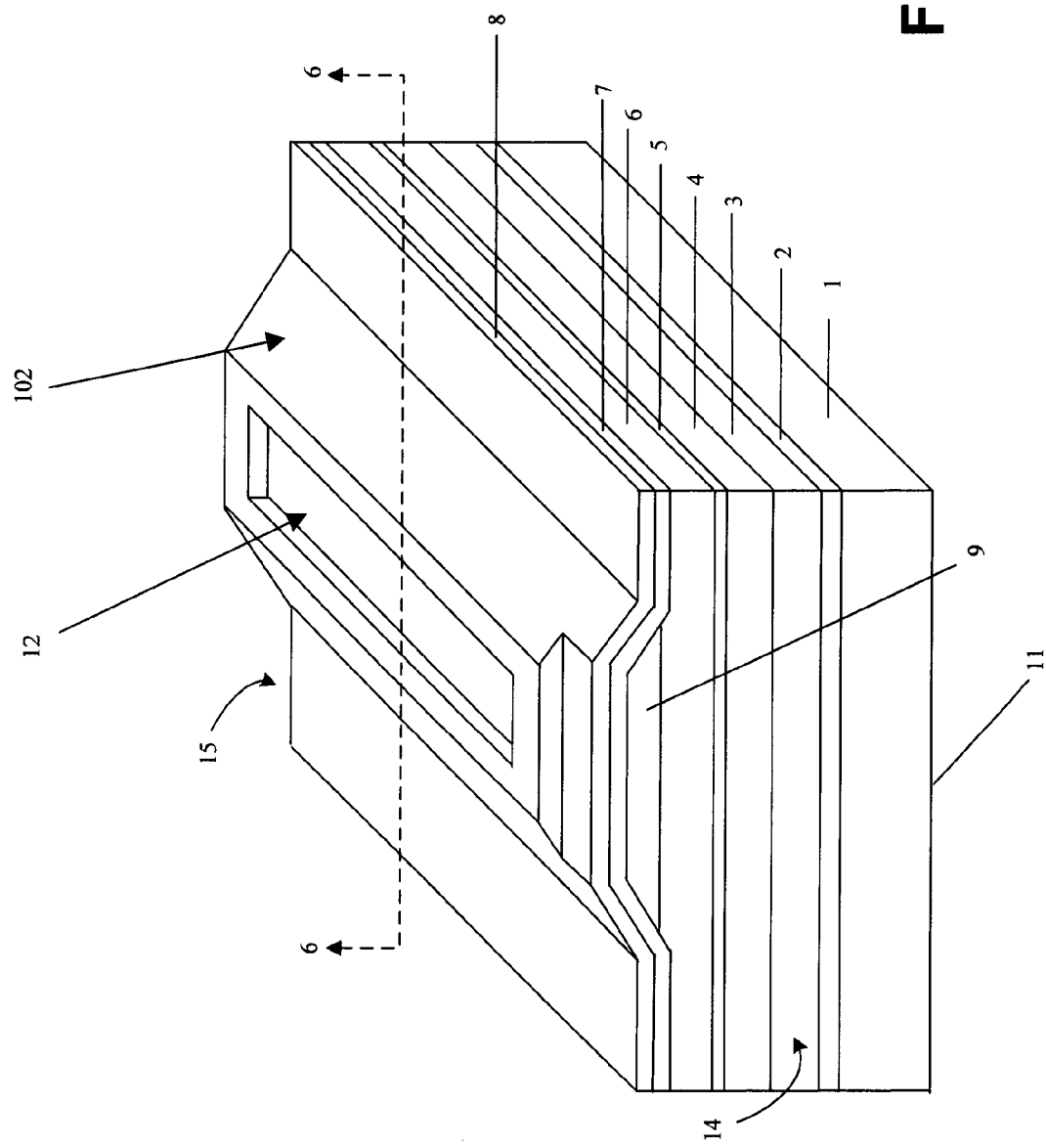
FIG. 11 is a schematic perspective view of a fifth implementation of a ridge waveguide diode laser with unpumped facet regions.
Figure 12:
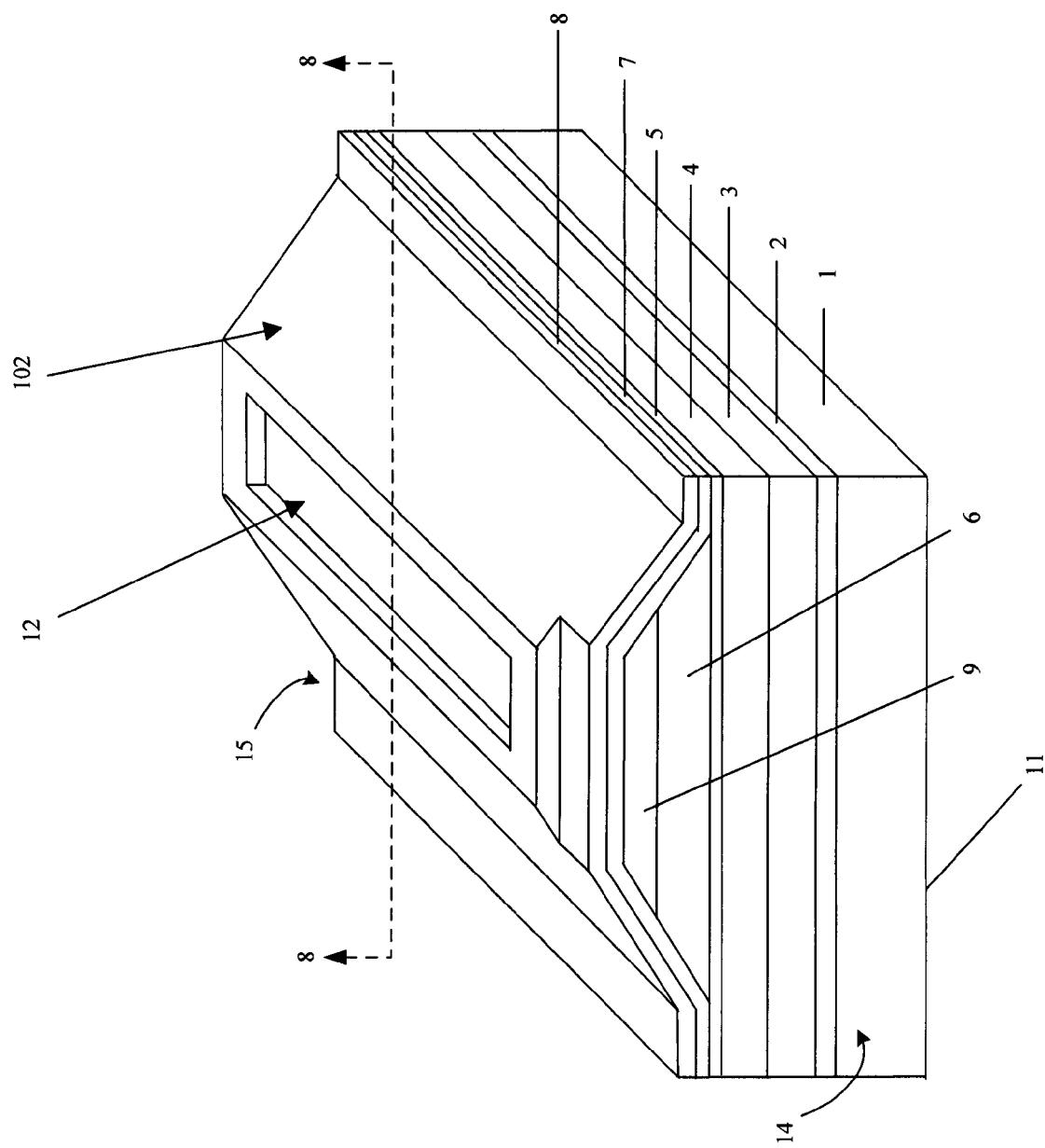
FIG. 12 is a schematic perspective view of a sixth implementation of a ridge waveguide diode laser with unpumped facet regions.

Similarly, a portion of the cap layer 10 can be removed in the vicinity of the front facet 14 and/or the back facet 15 in other diode laser structures described herein. For example, as shown in FIG. 11, one or more portions of the cap layer 10 can be removed in a diode laser in which the ridge 102 is defined by etching partially into the upper waveguide layer 6, and, as shown in FIG. 12, one or more portions of the cap layer 10 can be removed in a diode laser in which the ridge 102 is defined by etching completely through the upper waveguide layer 6. FIG. 5 shows a cross section of the diode laser shown in FIG. 11, and FIG. 6 shows a cross section of the diode laser shown in FIG. 12.

The diode lasers described herein have a metallization contact layer 8 that contacts that cap layer 10 of the diode laser to inject current into the active layer 5 in the middle of the diode laser, but that does not contact the cap layer 10 within about 10-100 microns, or more particularly, 20-60 microns of the front facet 14 and the back facet 15 of the diode laser. Thus, current is not injected into the active layer 5 in the vicinity of the facets 14 and 15, which leads to lower Ohmic heating and a lower temperature increase in the laser 100 near the facets 14 and 15. Without wishing to be bound by theory, it is believed that in a device having unpumped regions near the facets 14 and 15, less thermal oxidation occurs at the facets 14 and 15, which leads to better short- and long-term performance of the device.

Facet Passivation

After a wafer has been fabricated to create the diode laser structures described above, the wafer is cleaved into individual diode lasers 100, and one or more of the front and back facets 14 and 15 of the diode laser are passivated and coated. The cleaving, coating, and facet passivation of the individual diode lasers 100 is performed in an environment in which the humidity and oxygen content is controlled. By performing facet processing in the controlled environment, a native oxide layer having a reproducible thickness is formed on the facets after cleaving, and a predetermined amount of the initial native oxide layer can be removed while an amorphous surface layer with a predetermined thickness is created at the facets. With a uniform thickness of the native oxide layer, reproducible and predictable performance of the devices can be obtained more easily. After removal of a portion of the native oxide layer and formation of the amorphous surface layer the facets are passivated and optical coatings are deposited on the facets.

Figure 13:
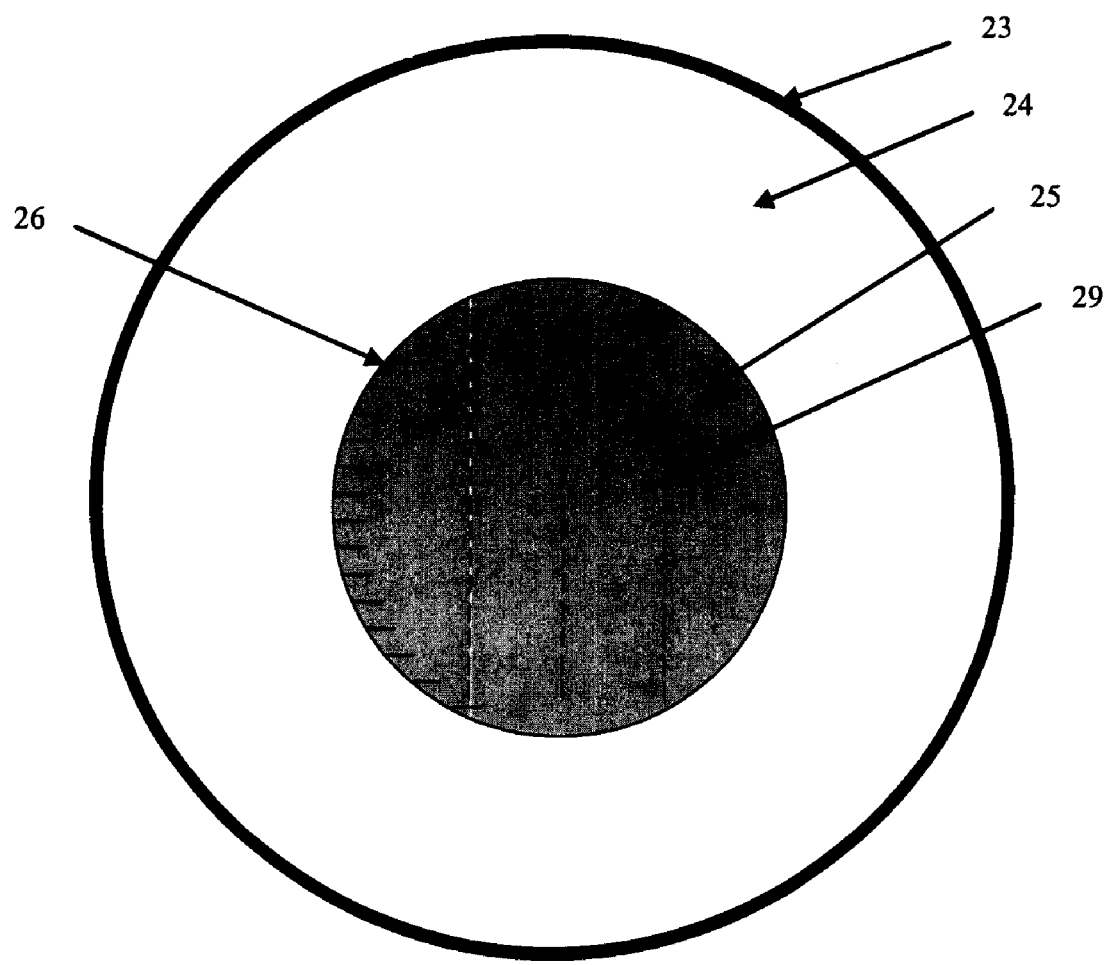
FIG. 13 is a schematic top view of a wafer positioned on a dicing tape.

Referring to FIG. 13, after epitaxial growth of the wafer, p-side processing, wafer thinning, and n-side processing, the diode laser wafer 25 is initially placed on dicing tape 24 that is held in place by a hoop 23. The wafer 25 is placed on the dicing tape 24 in such a manner that air bubbles are not trapped between the wafer and the tape. For example, one edge of the wafer 100 can be placed against dicing tape 24, and then the wafer can be gradually lowered onto the tape, such that air is not trapped between the wafer 25 and the tape.

Figure 14:
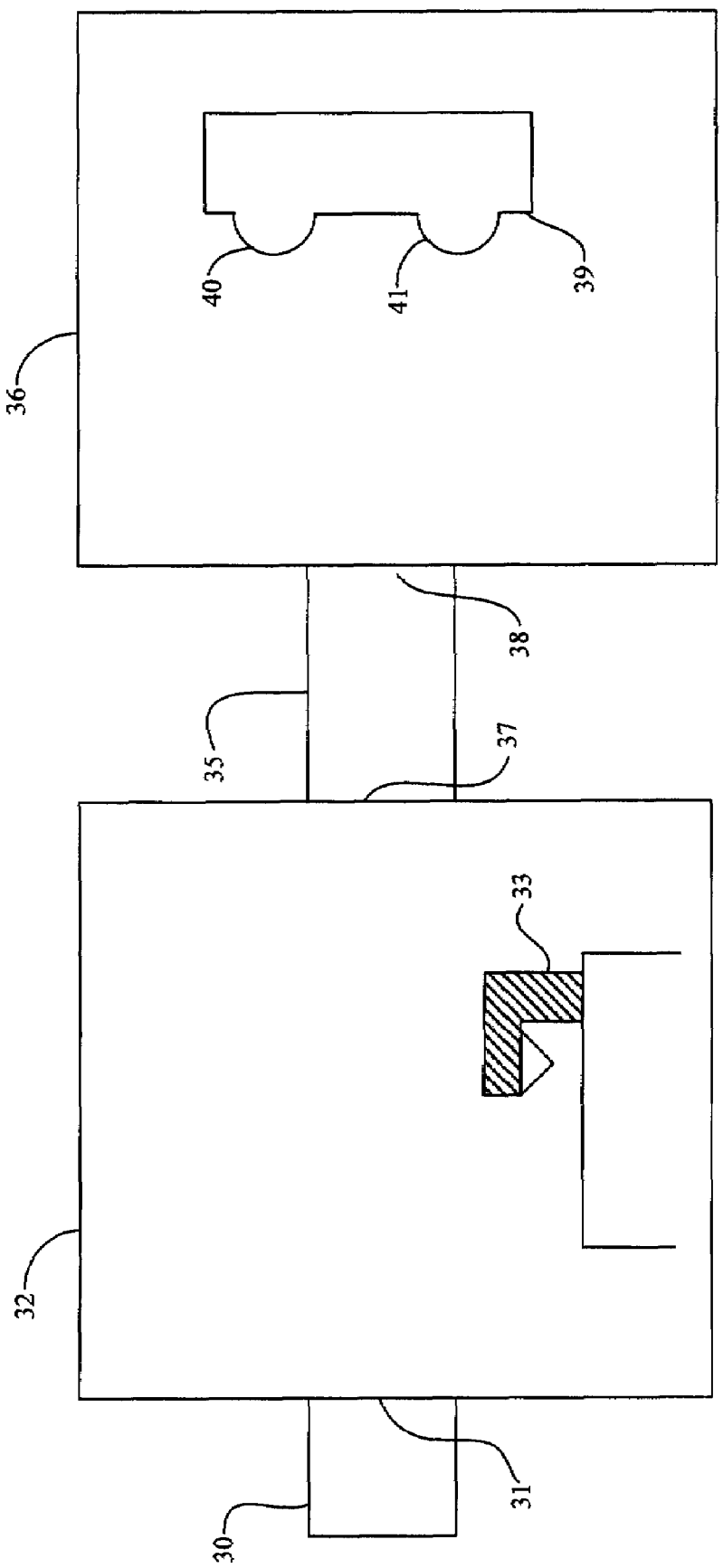
FIG. 14 is a schematic diagram of a chamber for processing a wafer of diode lasers.

Referring to FIG. 14, before cleaving the wafer 25, the wafer 25 and the hoop 23 are loaded into a loadlock 30 that is connected to a cleaving chamber 32 by a gate-valve 31. After placing the wafer 25 and the hoop 24 in the loadlock 30, the air in the load lock 30 is replaced with an atmosphere with low water and oxygen content (for example, less than about 10 ppm oxygen and water). After the desired atmosphere in the loadlock 30 is attained, the gate-valve 31 is opened, and the wafer 25 and the hoop 24 are moved to the cleaving chamber 32, in which an atmosphere having a predetermined amount of water and oxygen content (for example, about <2 ppm each of water and oxygen) is maintained. After loading the wafer 25 and the hoop 23 into the cleaving chamber 32, the gate-valve 31 is closed. The total pressure in the gate-valve 30 and the cleaving chamber 32 can be maintained slightly above nominal atmospheric pressure, so that small leaks do not admit appreciable amounts of water and oxygen into the loadlock 30 or the cleaving chamber 32.

Inside the cleaving chamber 32, the wafer 24 is placed on an automatic scribe and break tool 33, where the individual diode lasers are defined on the wafer 25. Referring again to FIG. 13, to define individual diode lasers on the wafer, scribe marks 26 are placed along the edge of the wafer 25 to delineate where the front 14 and rear facets 15 (FIG. 1A) of a diode laser will be cleaved. Next, the wafer is rotated by 90 degrees, and chip marks 29 are scribed within the interior of the wafer 25 to define the width of a laser bar that will be cleaved from the wafer 25. Next, the wafer is rotated back 90 degrees, and the wafer 25 is broken along the first set of scribe marks 26. These scribe marks allow propagation of the break along the length of the diode laser wafer 25. Next, the wafer is again rotated by 90 degrees, and the wafer 25 is broken along the set of chip marks 29 within the interior of the wafer. Other methods can also be used to cleave individual diode lasers from the wafer 25. For example, in "scribeless dicing," the need for the set of chip marks 29 is obviated by an additional p-side processing step, such as, for example, deep etching of the wafer, which provides a suitable cleavage plane to break the laser bars into individual diode lasers 100.

Cleaving the wafer exposes facets of the diode lasers to the atmosphere within the cleaving chamber 32, such that the front and rear facets are oxidized, even though they remain within the controlled environment within the cleaving chamber 32. However, because the oxygen and humidity levels of the atmosphere within the chamber 32 are monitored continuously and are controlled to low and reproducible levels, the oxide layer formed on the facets attain substantially the same thickness on every wafer that is cleaved within the chamber 32. Although a relatively thin oxide layer on the facets is desirable so that subsequent removal of the layer is accomplished efficiently, the thickness of the oxide should be substantially constant for every wafer processed in the chamber 32.

After cleaving, the individual diode lasers are individually removed from the dicing tape and stacked in a facet coating mount, for example, by an automated bar stacking tool. The automated bar stacking tool can be used as an alternative to manual handling of the individual diode lasers because handling individual lasers within the cleaving chamber 32 is difficult. The diode lasers are stacked vertically to expose the front 14 and back facets 15 for facet coating. Placement of the lasers on the stack is controlled and repeatable to minimize the amount of overspray during coating, which can cause problems during packaging of the lasers 100. The lasers can be stacked directly on top of each other, or layers of lasers can be alternated with spacers.

Once the facet-coating mount has been loaded with diode lasers 100, the facet-coating mount is transferred to a facet coating chamber 36 through a facet coating loadlock 35. The lasers in the facet-coating mount are transferred from the cleaving chamber 32 to the airtight loadlock 35, and a gate-valve 37 between the load lock 35 and the cleaving chamber 32 is closed. The atmosphere inside the loadlock 35 is maintained under conditions substantially similar to the atmosphere within the cleaving chamber 32 (that is, low oxygen and water content), so that the oxide layer formed on the facets is not altered by loading the cleaved lasers into the loadlock 35. After loading the stacked lasers into the loadlock 35, the atmosphere within the loadlock 35 is evacuated (for example, to less than about $10^{-5}$ Torr), a gate-valve 38 between the loadlock 35 and the facet coating chamber 36 is opened, the stacked lasers are transported into the facet coating chamber 36, and the gate-valve 38 is closed.

After loading the lasers and the mounts into the facet coating chamber 36, the atmosphere in the chamber is evacuated to a base pressure of less than about $5 \times 10^{-8}$ Torr. Inside the facet coating chamber 36, a dual-source ion-beam deposition tool 39 is used to remove a portion of the native oxide layer on the lasers and to apply a coating to the facets. A low-energy (for example, about 25-100 eV) ion beam from the first ion source 40 of the tool 39 is directed at the facets to partially remove the native oxide layer on the front facets 14 of the lasers 100. Source gases for the first source 40 may include argon, neon, nitrogen, hydrogen, and forming gas (that is, about 5% hydrogen and about 95% nitrogen). The ion bombardment of the front facets 14 is monitored in-situ with an ellipsometer to record progress of the surface oxide etching.

Figure 15:
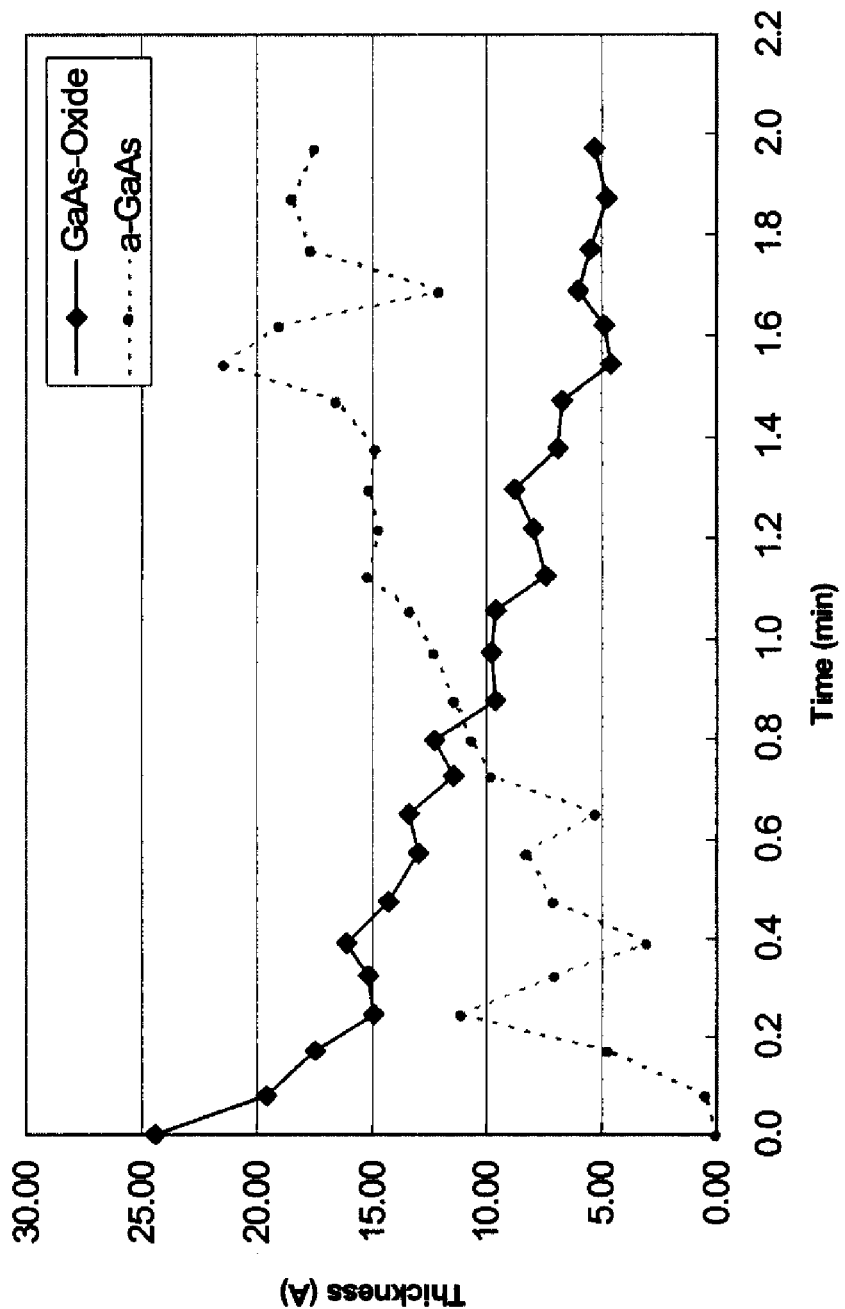
FIG. 15 is a plot of the thickness of a native oxide layer and an amorphous layer at a facet of a diode laser as an ion beam bombards the facet.

As shown in FIG. 15, representative data recorded during ion bombardment of the front facet indicate that the native GaAs-oxide layer on the facet 14 is decreased over time as the bombardment occurs. As the surface oxide is etched by the ion beam, a subsurface amorphous GaAs ($\alpha$-GaAs) layer forms at the facet. As shown in FIG. 15, after approximately 90 seconds, the thickness of the surface oxide layer on the facet attains an asymptotic value of approximately 5 Angstroms, while the subsurface amorphous layer attains a thickness of approximately 20 Angstroms. Ion bombardment for longer times does not significantly reduce the final thickness of the native oxide layer, and the native oxide is never completely removed from the facet. Because the atmospheres in the cleaving chamber, the loadlock, and the facet coating chamber 36 are carefully controlled, the initial and final thicknesses of the front facets of each laser are substantially equal on all lasers processed in the chambers. For example, as shown in FIG. 15, the initial thickness of the native oxide layer on the front facet of the lasers can be about 25 Angstroms, and the final thickness can be about 5 Angstroms.

Referring again to FIG. 14, after facet cleaning (that is, partial native oxide layer removal and amorphous layer formation), the front facet is passivated with a passivation layer that prevents reoxidation of the facet 14. The passivation layer is formed by sputter deposition with an ion beam from the second ion source 41 of the tool 39. A higher-energy (for example, about 500-1000 eV) ion beam from the second source 41 is directed at a target in the chamber 36, and material sputtered off the surface of the target is deposited on the front facets 14 of the lasers 100. Source gases for the second source 40 may include argon, nitrogen, or xenon. The target can include silicon, and typical passivation layers can include amorphous silicon or hydrogenated amorphous silicon and can be about 20-50 Angstroms thick (for example, about 25, 30, 35, 40, or 45 Angstroms thick).

Finally, an antireflection (AR) coating of low index of refraction material(s) is deposited on the front facet of the laser by sputter deposition using the second ion beam source 41 of the tool 39. Typical examples of AR coating materials include aluminum oxide ($Al_2O_3$), tantalum pentoxide ($Ta_2O_5$), silicon dioxide ($SiO_2$), and silicon nitride ($Si_3N_4$).

After preparing the front facets of the lasers, the lasers are rotated by 180 degrees, and the processing steps are repeated to prepare the rear facets 15 of the lasers 100. When preparing the rear facets, the native oxide layer is reduced and an amorphous layer is formed, the facets are passivated, and a high reflectivity ("HR") coating is deposited. To create a high reflectivity coating, alternating layers of $Al_2O_3$ and amorphous silicon or alternating layer of $Al_2O_3$ and $Ta_2O_5$ can be deposited on the rear facet.

Figure 16:
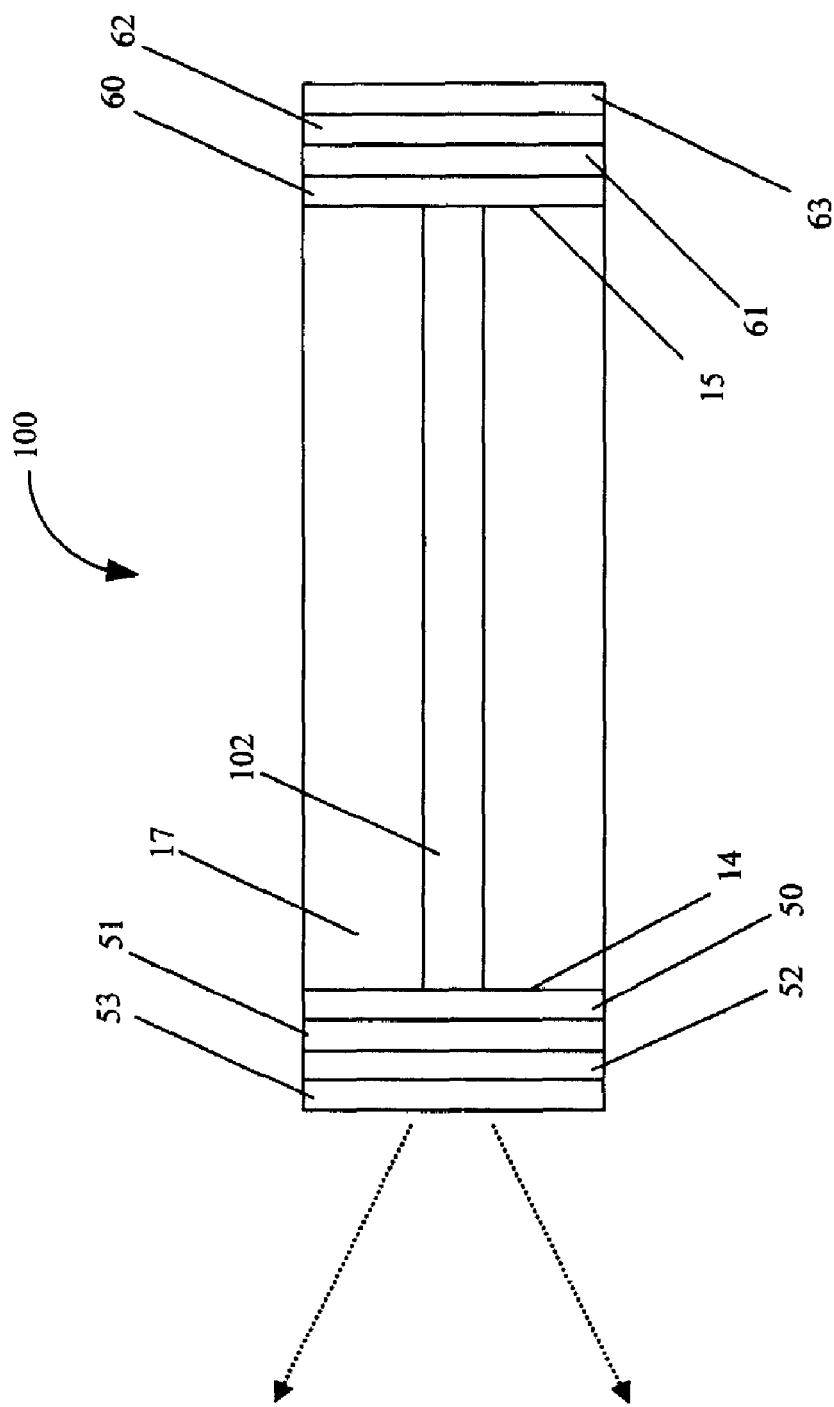
FIG. 16 is a schematic top view of a diode laser.

As shown in FIG. 16, after processing, an individual diode laser 100 includes a ridge 102, a front facet 14, and a back facet 15. The front facet 14 includes an amorphous layer 50, a native oxide layer 51, a passivation layer 52, and an AR coating 53. The back facet 14 includes an amorphous layer 60, a native oxide layer 61, a passivation layer 62, and an HR coating 63.

Performance

Figure 17:
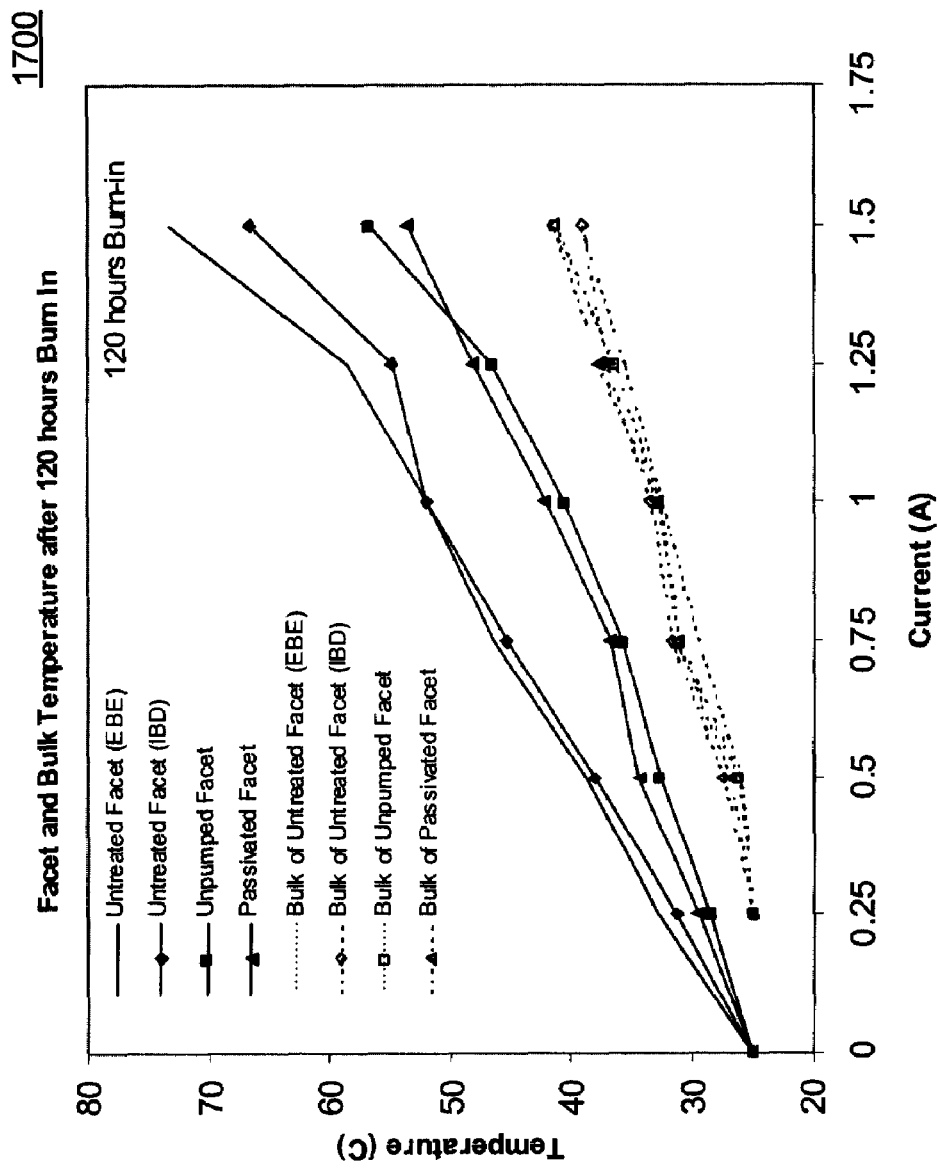
FIG. 17 is a graph of experimental results comparing facet temperatures and injection currents for various ridge waveguide diode lasers with unpumped facets.

Referring to FIG. 17, a graph 1700 displays the experimental results comparing facet temperatures (in Celsius) and injection currents (in Amps) for various ridge waveguide diode lasers after 120 hours of burn-in. As shown in graph 1700, the facet temperature is lower across all currents up to about 1.5 A for a laser diode having unpumped regions at the facets when compared with an otherwise identical diode laser having a metallization contact layer that contacts the cap layer across the entire length of the ridge in the diode laser for a range of currents up to about 1.5 A.

Figure 18:
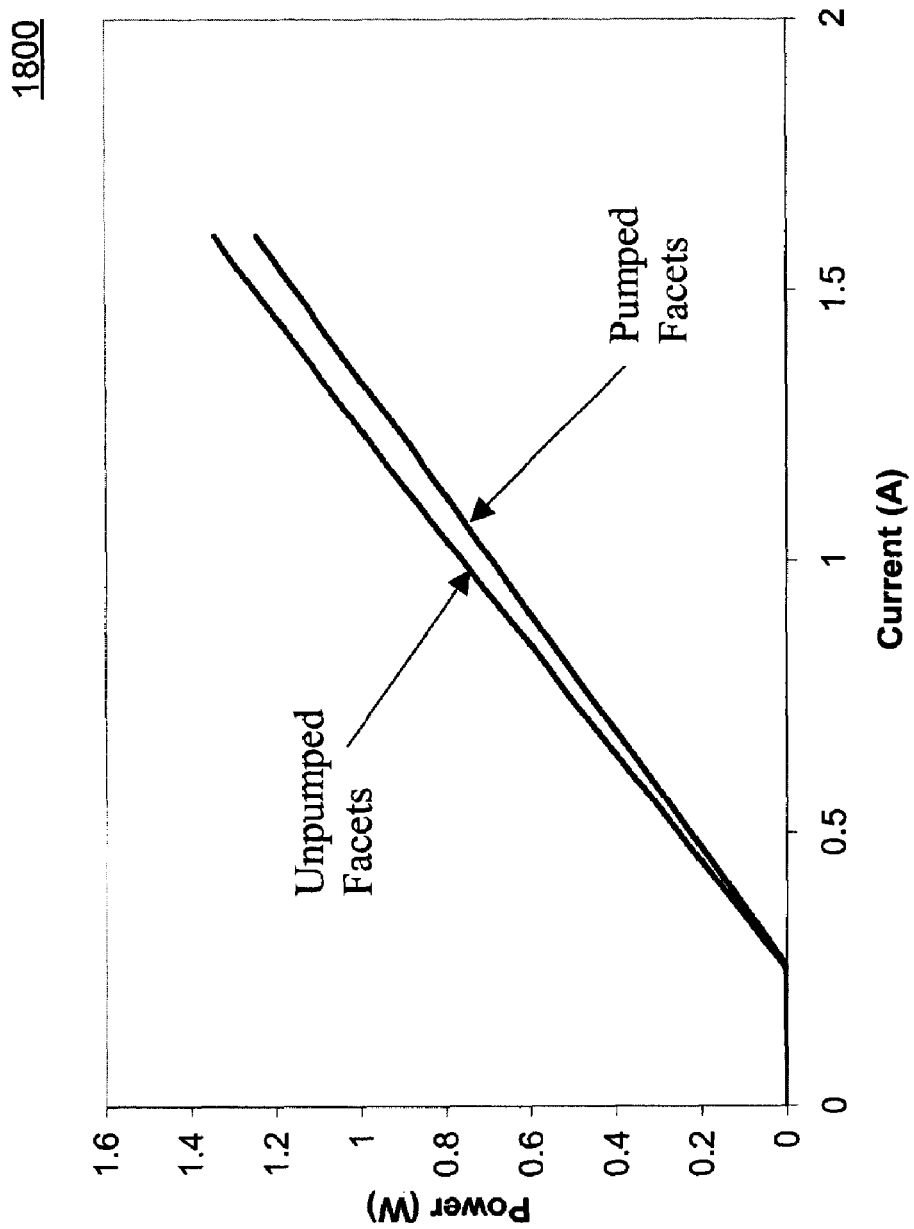
FIG. 18 is a graph comparing output powers and injection currents for different ridge waveguide diode lasers.

Referring to FIG. 18, a graph 1800 displays the output power (in Watts) versus the injection current (in Amps) for ridge waveguide diode lasers after a suitable burn-in period. The power emitted from a diode laser 100 having unpumped facets (upper graph) is greater than the power emitted from an otherwise identical laser having pumped facets (lower graph).

Figure 19:
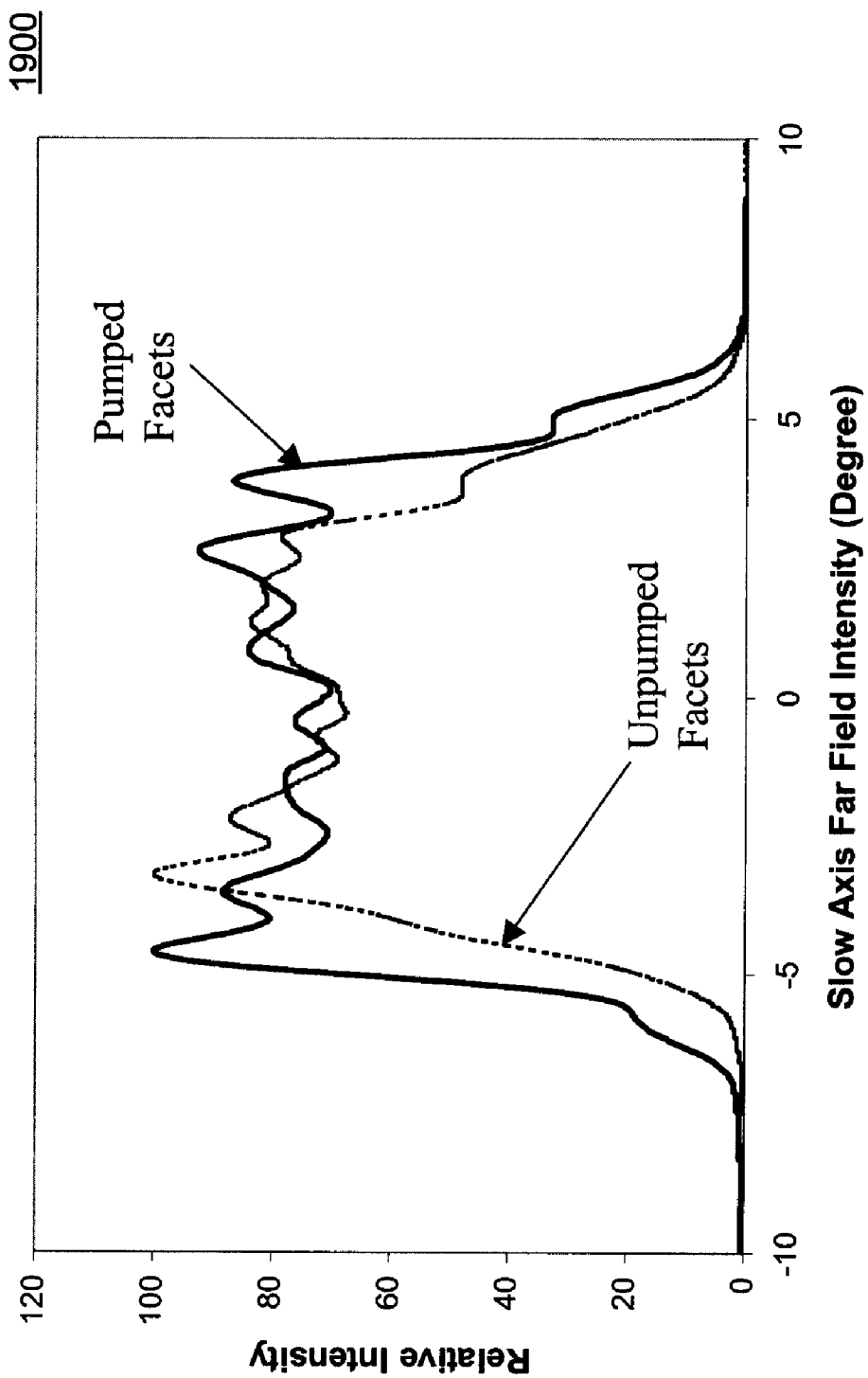
FIG. 19 is a graph comparing the beam divergence of the different ridge waveguide diode lasers.

Referring to FIG. 19, a graph 1900 displays a relative intensity versus slow axis far field intensity for different ridge waveguide diode lasers. The far-field divergence along the slow axis (that is, parallel to the width of the diode laser 100) of the beam emitted from diode laser 100 having unpumped facets (dot-dash line) is lower than the far-field divergence of the beam emitted from an otherwise identical diode laser having pumped facets (solid line).

Figure 20:
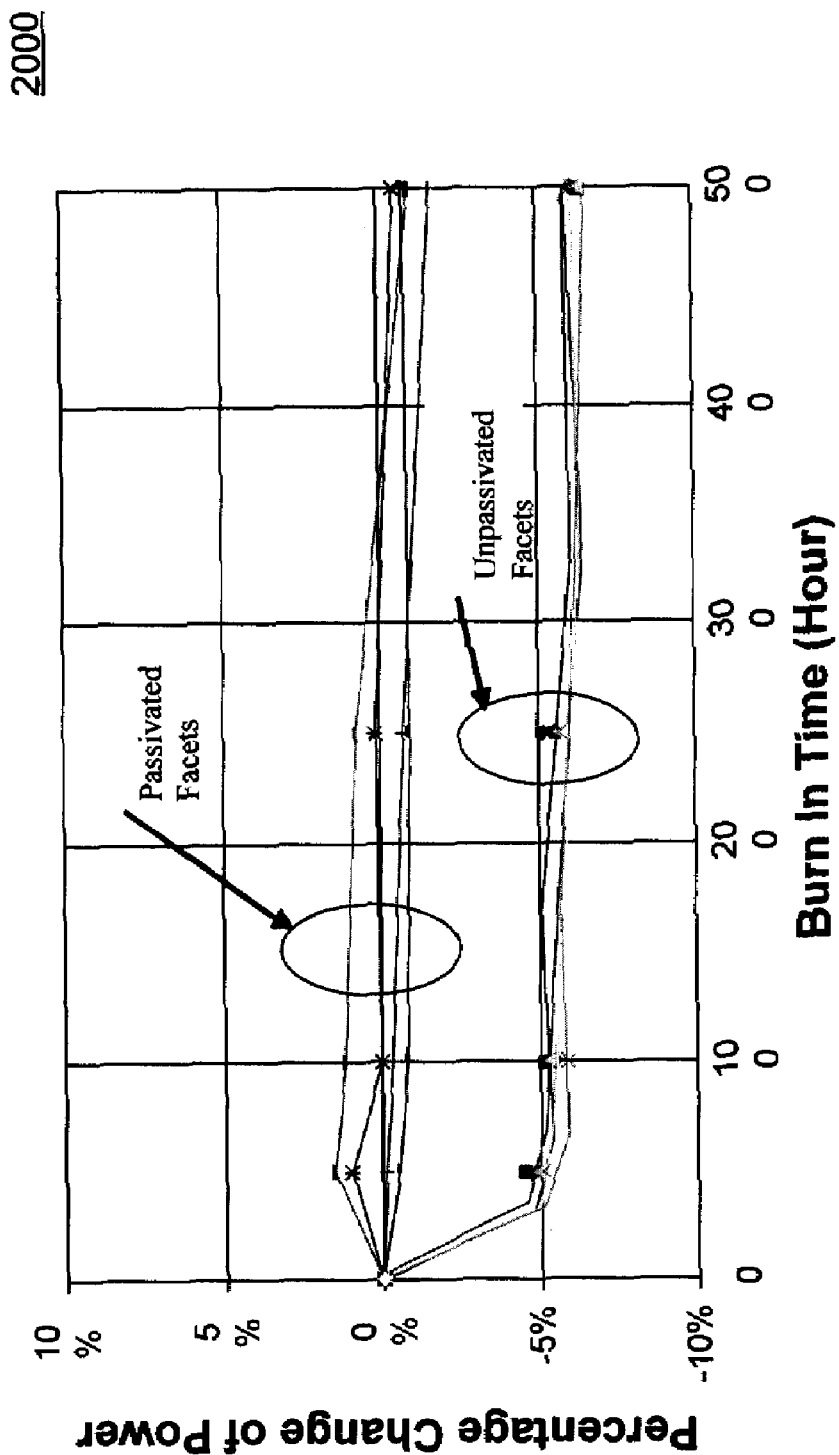
FIG. 20 is a graph comparing the effect of burn-in on lasers having passivated and unpassivated facets.

Referring to FIG. 20, a graph 2000 displays a graph of percentage change of power versus burn-in time (in hours) for different diode lasers. The graph 2000 shows the effect of burn-in on the different diode lasers having passivated and unpassivated facets. In particular, when the facets of the diode laser are passivated (upper lines) to prevent the formation of additional oxide layers, the power output from the diode laser does not degrade after a burn in period (as shown in the lower lines).

OTHER IMPLEMENTATIONS

A number of implementations have been described. Nevertheless, it will be understood that various modifications may be made. Accordingly, other implementations are within the scope of the following claims.

What is claimed is:

1. A method of preparing a diode laser, the method comprising:
   controlling an atmosphere within a chamber to a pressure within about 20 percent of atmospheric pressure, such that the controlled atmosphere has an oxygen content less than about 10 ppm and a water vapor content less than about 10 ppm;
   cleaving the diode laser from a wafer within the controlled atmosphere of the chamber to form a native oxide layer having a uniform and predetermined thickness on at least one facet of the diode laser;
   cleaning the facet of the diode laser including partially removing the native oxide layer on the facet; and
   passivating the facet of the diode laser.

2. The method of claim 1, wherein cleaning includes forming an amorphous surface layer on the facet of the diode laser.

3. The method of claim 1, wherein controlling the atmosphere within the chamber includes controlling the atmosphere within a first chamber.

4. The method of claim 3, further comprising transporting the diode laser from the first chamber to a second chamber within a controlled atmosphere, wherein cleaning and passivating occur within the second chamber.

5. The method of claim 1, wherein the controlled atmosphere has a pressure greater than atmospheric pressure.

6. The method of claim 1, wherein cleaving the diode laser from the wafer comprises:
   scribing cleave marks along an edge of the wafer;
   scribing chip marks within an interior of the wafer;
   breaking the wafer along the cleave marks; and
   breaking the wafer along the chip marks.

7. The method of claim 1, wherein cleaving the laser from the wafer comprises:
   scribing cleave marks along an edge of the wafer;
   breaking the wafer along the cleave marks; and
   breaking the wafer along lines etched into to wafer during wafer processing.

8. The method of claim 1, further comprising:
   transporting the wafer from the controlled atmosphere to a vacuum chamber without exposing the wafer to a greater partial pressure of oxygen or water vapor than exists in the controlled atmosphere; and
   evacuating the vacuum chamber to a base pressure of less than about $10^{-8}$ Torr.

9. The method of claim 8, wherein partially removing the native oxide layer comprises bombarding the native oxide layer with an ion beam within the vacuum chamber.

10. The method of claim 8, wherein cleaning includes forming an amorphous surface layer on the facet of the diode laser including bombarding the native oxide layer with an ion beam within the vacuum chamber.

11. The method of claim 9, wherein the bombarding ion beam comprises ions selected from the group consisting of xenon ions, argon ions, neon ions, nitrogen ions, protons and forming gas ions.

12. The method of claim 8, wherein passivating the facet comprises depositing a layer of material comprising silicon on the facet within the vacuum chamber.

13. The method of claim 12, wherein the layer of material comprises amorphous silicon.

14. The method of claim 12, wherein the layer of material comprises hydrogenated amorphous silicon.

15. The method of claim 1, wherein:
   cleaving the diode laser from a wafer includes cleaving within the controlled atmosphere of the chamber to form a native oxide layer having a predetermined thickness on front and back facets of the diode laser;
   cleaning includes cleaning the front and back facets of the diode laser including partially removing the native oxide layer on the front and back facets; and
   passivating includes passivating the front and back facets of the diode laser.

16. The method of claim 15, further comprising:
   depositing an anti-reflection coating on the front facet; and
   depositing a high reflection coating on the back facet.

17. The method of claim 15, further comprising:
   rotating the diode laser without exposing the diode laser to atmosphere between the steps of cleaning and passivating the front facet, and the steps of cleaning and passivating the back facet; and
   rotating the diode laser without exposing the diode laser to atmosphere between the steps of depositing the anti-reflection coating on the front facet and depositing the high reflection coating on the back facet.

18. The method of claim 1, wherein:
   cleaving the diode laser includes forming a native oxide layer having a uniform and predetermined thickness on front and back facets of the diode laser;
   cleaning the facet includes cleaning front and back facets of the diode laser including partially removing the native oxide layer on the front and back facets; and
   passivating the facet includes passivating the front and back facets of the diode laser; and
   the method further comprises rotating the diode laser without exposing the diode laser to atmosphere between the steps of cleaning the front facet and passivating the front facet, and the steps of cleaning the back facet, and passivating the back facet.

19. The method of claim 1, wherein:
   cleaving the diode laser includes forming a native oxide layer having a uniform and predetermined thickness on front and back facets of the diode laser;
   cleaning the facet includes cleaning front and back facets of the diode laser including partially removing the native oxide layer on the front and back facets;
   passivating the facet includes passivating the front and back facets of the diode laser; and
   the method further comprises rotating the diode laser without exposing the diode laser to atmosphere before the steps of cleaning and passivating the front facet.

20. The method of claim 15, further comprising:
   depositing a high reflection coating on the back facet after passivating the back facet;
   depositing an anti-reflection coating on the front facet; and
   rotating the diode laser without exposing the diode laser to atmosphere between the steps of depositing the high reflection coating and depositing the anti-reflection coating.

21. The method of claim 1, wherein:
   cleaving the diode laser from a wafer includes forming a native oxide layer having a uniform and predetermined thickness on front and back facets of the diode laser;
   cleaning the facet includes cleaning front and back facets of the diode laser including partially removing the native oxide layer on the front and back facets;
   passivating the facet includes passivating the front and back facets of the diode laser; and
   the method further comprises rotating the diode laser without exposing the diode laser to atmosphere before step of depositing the anti-reflection coating on the front facet.

22. The method of claim 15, further comprising:
partially removing the native oxide on front facet, forming an amorphous layer on the front facet, passivating the front facet, and deposit an anti-reflection coating on the front facet; then
rotating the diode laser without exposing the diode laser to atmosphere; and then
partially removing the native oxide on back facet, forming an amorphous layer on the back facet, passivating the back facet, and depositing a high reflection coating on the back facet.

23. The method of claim 15, further comprising:
partially removing the native oxide on back facet, forming an amorphous layer on the back facet, passivating the back facet, and depositing a high reflection coating on the back facet; then
rotating the diode laser without exposing the diode laser to atmosphere; and then
partially removing the native oxide on front facet, forming an amorphous layer on the front facet, passivating the front facet, and deposit an anti-reflection coating on the front facet.

24. The method of claim 15, further comprising:
partially removing the native oxide on front facet, forming an amorphous layer on the front facet, and passivating the front facet; then
rotating the diode laser without exposing the diode laser to atmosphere; then
partially removing the native oxide on back facet, forming an amorphous layer on the back facet, passivating the back facet, and depositing a high reflection coating on the back facet; then
rotating the diode laser without exposing the diode laser to atmosphere; and then
depositing an anti-reflection coating on the front facet.

25. The method of claim 15, further comprising:
partially removing the native oxide on back facet, forming an amorphous layer on the back facet, and passivating the back facet; then
rotating the diode laser without exposing the diode laser to atmosphere; and then
partially removing the native oxide on front facet, forming an amorphous layer on the front facet, passivating the front facet, and deposit an anti-reflection coating on the front facet; then
rotating the diode laser without exposing the diode laser to atmosphere; and then
depositing a high reflection coating on the back facet.

26. The method of claim 1, further comprising depositing an anti-reflection coating on the facet.

27. The method of claim 26, wherein the anti-reflection coating comprises one or more materials selected from the group consisting of aluminum oxide, tantalum pentoxide, silicon dioxide, and silicon nitride.

28. The method of claim 1, further comprising depositing a high reflection coating on the back facet.

29. The method of claim 28, wherein the high reflection coating comprises alternating layers of low index of refraction material and high index of refraction material.

30. The method of claim 29, wherein the low index of refraction material comprises aluminum oxide and wherein the high index of refraction material comprises amorphous silicon.

31. The method of claim 29, wherein the low index of refraction material comprises aluminum oxide and wherein the high index of refraction material comprises tantalum pentoxide.

32. The method of claim 1, wherein the native oxide layer has a reproducible thickness.

* * * * *

UNITED STATES PATENT AND TRADEMARK OFFICE
CERTIFICATE OF CORRECTION

PATENT NO. : 7,687,291 B2  Page 1 of 1
APPLICATION NO. : 11/277602
DATED : March 30, 2010
INVENTOR(S) : Greg Charache et al.

It is certified that error appears in the above-identified patent and that said Letters Patent is hereby corrected as shown below:

On the title page, item [75] Inventors: after Ching-Long Jiang, delete "Bele Mead" and insert --Belle Mead--.

Title page, item [57] abstract, column 2, line 6, delete "hating" and insert --having--.

Signed and Sealed this

Fifteenth Day of June, 2010

David J. Kappos
*Director of the United States Patent and Trademark Office*